US008980677B2

(12) United States Patent
Lewis et al.

(10) Patent No.: US 8,980,677 B2
(45) Date of Patent: Mar. 17, 2015

(54) TRANSPARENT CONTACTS ORGANIC SOLAR PANEL BY SPRAY

(71) Applicants: Jason Lewis, Lutz, FL (US); Jian Zhang, Tampa, FL (US); Xiaomei Jiang, Tampa, FL (US)

(72) Inventors: Jason Lewis, Lutz, FL (US); Jian Zhang, Tampa, FL (US); Xiaomei Jiang, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 13/919,533

(22) Filed: Jun. 17, 2013

(65) Prior Publication Data
US 2013/0280847 A1    Oct. 24, 2013

Related U.S. Application Data

(63) Continuation-in-part of application No. 13/400,352, filed on Feb. 20, 2012, now abandoned, which is a continuation of application No. PCT/US2010/058732, filed on Dec. 2, 2010.

(60) Provisional application No. 61/265,963, filed on Dec. 2, 2009.

(51) Int. Cl.
H01L 21/00 (2006.01)
H01L 51/40 (2006.01)
(Continued)

(52) U.S. Cl.
CPC ............ *H01L 51/0003* (2013.01); *B82Y 10/00* (2013.01); *H01L 51/0023* (2013.01); *B82Y 20/00* (2013.01); *H01L 51/442* (2013.01); *H01L 51/0036* (2013.01); *H01L 51/0047* (2013.01);
(Continued)

(58) Field of Classification Search
USPC ........ 438/73, 82, 99, 679, 722, 944; 136/263, 136/256; 427/74, 427.7
See application file for complete search history.

(56) References Cited

U.S. PATENT DOCUMENTS 4,084,985 A * 4/1978 Evans, Jr. ...................... 136/251
4,451,969 A * 6/1984 Chaudhuri ...................... 438/62

(Continued)

FOREIGN PATENT DOCUMENTS

JP    5275728 A    10/1993
JP    2005244159 A    9/2005
WO   2011068968 A2   6/2011

OTHER PUBLICATIONS

Girotto et al. High-Performance Organic Solar Cells with Spray-Coated Hole-Transport and Active Layers., Advanced Functional Materials, vol. 21, 2011, pp. 64-72.*

(Continued)

Primary Examiner — Mary Wilczewski
Assistant Examiner — Erik T Peterson
(74) Attorney, Agent, or Firm — Robert J. Varkonyi; Smith & Hopen, P.A.

(57) ABSTRACT

A method of fabricating organic solar panels with transparent contacts. The method uses a layer-by-layer spray technique to create the anode layer. The method includes placing the substrate on a flat magnet, aligning a magnetic shadow mask over the substrate, applying photoresist to the substrate using spray photolithography, etching the substrate, cleaning the substrate, spin coating a tuning layer on substrate, spin coating an active layer of P3HT/PCBM on the substrate, spray coating the substrate with a modified PEDOT solution, and annealing the substrate.

20 Claims, 20 Drawing Sheets

(51) Int. Cl.
| | |
|---|---|
| H01L 31/00 | (2006.01) |
| B05D 5/12 | (2006.01) |
| H01L 51/00 | (2006.01) |
| B82Y 10/00 | (2011.01) |
| B82Y 20/00 | (2011.01) |
| H01L 51/44 | (2006.01) |
| H01L 51/42 | (2006.01) |

(52) U.S. Cl.
CPC .......... H01L 51/4253 (2013.01); Y02E 10/549 (2013.01)
USPC ................. 438/82; 438/99; 438/73; 136/263; 427/74

(56) References Cited

U.S. PATENT DOCUMENTS

| | | | |
|---|---|---|---|
| 5,445,711 A * | 8/1995 | Tanski et al. .................... 216/13 |
| 5,988,527 A * | 11/1999 | Alosi ............................ 239/124 |
| 7,495,251 B2 | 2/2009 | Zhu et al. | |
| 7,704,674 B1 | 4/2010 | Amblard et al. | |
| 7,799,990 B2 | 9/2010 | Marks et al. | |
| 2008/0073511 A1 | 3/2008 | Svatos et al. | |
| 2008/0223445 A1 | 9/2008 | Marks et al. | |
| 2009/0126796 A1* | 5/2009 | Yang et al. .................... 136/263 |
| 2009/0155459 A1* | 6/2009 | Park et al. ........................ 427/74 |
| 2009/0229667 A1* | 9/2009 | Shrotriya et al. ............. 136/263 |
| 2011/0024734 A1* | 2/2011 | Furst et al. ...................... 257/40 |
| 2011/0308598 A1* | 12/2011 | Girotto ......................... 136/256 |
| 2012/0073639 A1* | 3/2012 | Park et al. ..................... 136/255 |

OTHER PUBLICATIONS

Na et al. Fully spray-coated ITO-free organic solar cells for low-cost power generation., Solar Energy Materials and Solar Cells, 2010, vol. 94, pp. 1333-1337.*
Kang et al. Fully spray-coated inverted organic solar cells., Solar Energy Materials, vol. 103, 2012, pp. 76-79.*
J.E. Lewis, Device Physics of Solution Processable Solar Cells., 2011, PhD Dissertation, Univ. of South Florida.*
International Preliminary Report on Patentability issued Jun. 5, 2012 for corresponding International Patent Application No. PCT/US2010/058732 with an International filing date of Dec. 2, 2010.
International Search Report for PCT/US2010/058732 dated Dec. 2, 2010.
Lewis et al., Fabrication of organic solar array for applications in microelectromechanical systems, Journal of Renewable and Sustainable Energy 1, vol. 1, 2009, pp. 1-8.
Lim etal., Spray-deposited poly(3,4-ethylenedioxythiophene):poly (styrenesulfonate) top electrode for organic solar cells, Applied Physics Letters, 93, 193301, 2008.
Shaheen et al., Fabrication of bulk heterojunction plastic solar cells by screen printing, Applied Physics Letters, 79 (18), 2996, 2001.
Aernouts et al., Polymer based organic solar cells using ink-jet printed active layers, Applied Physics Letters 92, 033306, 2008.
Dennler et al., Flexible Conjugated Polymer-Based Plastic Solar Cells: From Basics to Applications, Proceedings of the IEEE, vol. 93, No. 8, Aug. 2005, pp. 1429-1439.
Shaheen et al., 2.5% efficient organic plastic solar cells, Applied Physics Letters, 78 (6), 841, 2001.
Huang et al., A Semi-transparent Plastic Solar Cell Fabricated by a Lamination Process, Advanced Materials, vol. 20, 2008, pp. 415-419.
Krebs, Fabrication and processing of polymer solar cells:a review of printing and coating techniques, Solar Energy Materials & Solar Cells, vol. 93, 2009, pp. 394-412.

Liang et al., Development of New Semiconducting Polymers for High Performance Solar Cells, J. Am. Chem. Soc. vol. 131, 2009, pp. 56-57.
Ma et al., Thermally Stable, Efficient Polymer Solar Cells with Nanoscale Control of the Interpenetrating Network Morphology, Advanced Functional Materials, vol. 15, 2005, pp. 1617-1622.
Green et al., Solar Cell Efficiency Tables (Version 32), Prog. Photovolt: Res. Appl., 2008, 16:435-440.
Yu et al., Polymer Photovoltaic Cells: Enhanced Efficiencies via a Network of Internal Donor-Acceptor Heterojunctions, Science, vol. 270, 1995, pp. 1789-1791.
Zimmermann, Et Al., ITO-free wrap through organic solar cells—a module concept for cost-efficient reel-to-reel production, Sol. Energy Mater. Sol. Cells 91 (2007) 374-378.
Manceau, et al., ITO-free flexible polymer solar cells: from small model devices to roll-to-roll processed large modules, Org. Electron. 12 (2011) 566-574.
Waldauf, et al., High efficient inverted organic photovoltaics using solution based titanium oxide as electron selective contact, Appl. Phys. Lett. 89 (2006) 233517-233520.
Krebs and Norrman, Using light-induced thermocleavage in a roll-to-roll process for polymer solar cells, ACS Appl. Mater. Interfaces 2 (2010) 877-887.
Krebs, et al., A roll-to-roll process to flexible polymer solar cells: model studies, manufacture and operational stability studies, J. Mater Chem. 19 (2009) 5442-5451.
Krebs, et al., Large area plastic solar cell modules, Mater. Sci. Eng. B 138 (2007) 106-111.
Weickert, et al., Spray-deposited PEDOT:PSS for inverted organic solar cells, Sol. Energy Mater. Sol. Cells 94 (2010) 2371-2374.
Kim, et al., Performance optimization of polymer solar cells using electrostatically sprayed photoactive layers, Adv. Funct. Mater. 20 (2010) 3538-3546.
Kim, et al., Substrate heated spray-deposition method for high efficient organic solar cell: morphology inspection, Jap. J. Appl. Phys. 49 (2010) 01800-01804.
Zou, et al., Metal grid/conducting polymer hybrid transparent electrode for inverted polymer solar cells, Appl. Phys. Lett. 96 (2010) 203301-203304.
Zhou, et al., Inverted and transparent polymer solar cells prepared with vacuum-free processing, Sol. Eng. Sol. Cells 93 (2009) 497-500.
Yu, et al., Efficient inverted solar cells using TiO2 nanotube arrays, Nanotechnology 19 (2008) 255202-255207.
Li, et al., Efficient inverted polymer solar cells, Appl. Phys. Lett. 88 (2006) 253503-253506.
Van Zant, Microchip Fabrication, McGraw-Hill, New York, ISBN 0-07-135636-3, 2000, pp. 431-432.
Van Der Pauw, A method of measuring the resistivity and Hall coefficient on lamellae of arbitrary shape, Philips Tech. Rev. 20 (1958) 220-224.
Kline and McGehee, Morphology and charge transport in conjugated polymers, J Macromol. Sci. C: Polym. Rev. 46 (2006) 27-45.
Geiser, et al., Poly(3-hexylthiophene)/C60 heterojunction solar cells: implication of morphology on performance and ambipolar charge collection, Sol. Eng. Sol. Cells 92 (2008) 464-473.
Graupner, et al., Shallow and deep traps in conjugated polymers of high intrachain order, Phys. Rev. B 54 (1996) 7610-7613.
Nelson, Organic photovoltaic films, Curr. Opinion Solid State Mater. Sci. 6 (2002) 87-95.
Dennler, et al., A new encapsulation solution for flexible organic solar cells, Thin Solid Films 511-512 (2006) 349-353.
Krebs, All solution roll-to-roll processed polymer solar cells free from indium-tin-oxide and vacuum coating steps, Org. Electron. 10 (2009) 761-768.

* cited by examiner

TRANSPARENT CONTACTS ORGANIC SOLAR PANEL BY SPRAY

CROSS REFERENCE TO RELATED APPLICATIONS

This application is a continuation-in-part of U.S. application Ser. No. 13/400,352, entitled "Transparent Contacts Organic Solar Panel by Spray", filed Feb. 20, 2012, which is a continuation of International Application Serial Number PCT/US2010/058732 filed Dec. 2, 2010, which claims priority to U.S. Provisional Patent Application No. 61/265,963, filed Dec. 2, 2009, which is herein incorporated by reference.

FIELD OF INVENTION

This invention relates to organic solar cells; in particular, to a method of fabricating a thin film organic solar module using a novel layer-by-layer spray technique.

BACKGROUND

Organic solar cells (OSC) or organic photovoltaics (OPV) based on π-conjugated polymers (e.g. poly-3-hexylthiophene (P3HT)) and fullerene derivatives (e.g. [6,6]-phenyl C61 butyric acid methyl ester (PCBM)) have attracted attention over the past decades because they may provide a cost-effective route to wide use of solar energy for electric power generation.

These organic semiconductors have the advantage of being chemically flexible for material modifications, as well as mechanically flexible for the prospective of low-cost, large scale processing such as screen-printing or spraying on flexible substrates. The world's next generation of microelectronics may be dominated by "plastic electronics" and organic solar cells are expected to play an important role in these future technologies.

The photovoltaic process in organic solar cell devices consists of four successive possesses: light absorption, exciton dissociation, charge transport, and charge collection. Absorption of a photon creates an exciton (bounded electron-hole pair). The exciton diffuses to the interface of two different components, where exciton dissociation, or charge separation, occurs, followed by positive charges (holes) moving to the anodes and negative charges (electrons) to the cathode.

Several parameters determine the performance of a solar cell, namely, the open-circuit voltage ($V_{oc}$), short-circuit current ($I_{sc}$), and the so-called fill factor (FF). The overall power conversion efficiency η is defined as $\eta=(FF)*(I_{sc} V_{oc})/P_m$. Over the past decade, OPV efficiency has been significantly improved to over five percent in single cell and one percent in submodules owing to a better understanding of device physics, optimization of device engineering, and developments of new materials.

However, most of such organic solar cell devices are developed in laboratories with fabrication processes involving spin-coating for the photoactive layer and the use of high vacuum to deposit the metal cathode. This conventional technique limits the real potential of organic solar cells in the commercial market due to the high cost of manufacturing using high vacuum.

Recently, world-wide research efforts have been made to develop transparent contacts based on modified Poly(3,4-ethylenedioxythiophene) poly(styrenesulfonate) (PEDOT:PSS) solution. Y. Liang et al., *Development of New Semiconducting Polymers for High Performance Solar Cells*, J. Am. Chem. Soc., V. 131, 56-57 (2009). For large scale production, screen printing (S. Shaheen et al., *Fabrication of Bulk Heterojunction Plastic Solar Cells by Screen Printing*, Appl. Phys. Lett., V. 79, 2996-2998 (2001)) and ink jet printing (T. Aernouts et al., Polymer Based Organic Solar Cells Using Ink-Jet Printed Active Layers, App. Phys. Lett., Vol 92, 033306 (2008)) have been demonstrated mostly in OPV single cells.

Spraying methods, such as that described in Lim et al., have also been attempted. Lim et al., *Spray-Deposited Poly(3,4-ethylenedioxythiophene:Poly(styrenesulfonate) Top Electrode for Organic Solar Cells*, App. Phys. Lett., V. 93, 193301 (2008). However, such methods spray a thick layer of PEDOT:PSS to replace the need for metal cathode deposition using high vacuum. This thick layer of PEDOT:PSS sacrifices transparency, which is needed in certain application such as window technology. In fact, the thickness of the PEDOT:PSS layer produced by the method described in Lim et al. is over 2 μm. When thickness is over 1.26 μm, the transparency is below 1% (completely opaque), making Lim's method ineffective for producing transparent or even semi-transparent contacts for organic solar cells.

SUMMARY OF INVENTION

Conventional technology based on spin-coating and using metal as cathode contact greatly limits transparency of solar cells and posts difficulty for large scale manufacturing. The present invention provides a new spray technology that solves these two problems simultaneously using thin film organic layers applied via a layer-by-layer spray technique. The inverted organic solar photovoltaic cell may be fabricated onto most any desired substrates, both rigid and flexible. Exemplary substrates include cloth, glass, and plastic. For example, the substrate may be a low alkaline earth boro-aluminosilicate glass.

A patterned ITO layer is added to one face of the substrate, structured as a series of contacts oriented in a first direction on the substrate. A patterned interstitial layer of $Cs_2CO_3$, ZnO, or self-assembling molecules overlays the ITO layer, and aids in the ITO's function as the cathode for the inverted cell. The interstitial layer may be overlaid at any thickness known in the art to be useful for forming an ITO cathode. A thickness of between 5Å to 15 Å has been found especially useful. An active layer of poly-3(hexylthiophene) and [6,6]-phenyl C61-butyric acid methylester overlays interstitial the layer. While the thickness of the active layer may vary, testing has shown the active layer is especially useful at about 200 nm thick to about 500 nm thick, and more specifically at a thickness of about 200 to about 300 nm. An anodic layer comprising poly (3,4) ethylenedioxythiophene:poly-styrenesulfonate and 5 vol. % of dimethylsulfoxide overlays the active layer, and is about 100 nm to about 1 μm thick. In specific variations of the invention, the thickness of the anodic layer is about 100 nm to about 600 nm, or more specifically about 100 nm. The inverted cell is sealed using a UV-cured epoxy encapsulant or silver paint. The completed inverted organic solar photovoltaic cell has in certain embodiments, an active layer thickness of 200 nm and an anodic layer the thickness of 600 nm.

The inverted organic solar photovoltaic cell may be constructed in an array, such as a series of 50 individual cells having active area of 60 mm². In some variations, the array is oriented as 10 cells disposed in series in one row, and 5 rows in parallel connection.

The method of preparing the inverted organic solar photovoltaic cell is also provided. A substrate was obtained comprising a transparent piezoelectric material coated with indium tin oxide. In some variations, a positive photo resist was spin-coated at about 4500 rpm, and then soft baked at 90° C. to pattern the indium tin oxide. The baked positive photo resist was then exposed to UV irradiation at a constant intensity mode set to about 25 watts, developed, and hard-baked at about 145° C. The excess photoresist was cleaned off excess using acetone and cotton; and then etched with a solution of 20% HCl-7% $HNO_3$ at 100° C. The inverted organic solar photovoltaic cell was then optionally cleaned using acetone followed by isopropanol, then followed by a UV-ozone clean for at least fifteen minutes. A cathode was formed by spray coating a layer of cesium carbonate on top of the indium tin oxide coating. The cesium carbonate was optionally prepared as known in the art. A useful preparation was made by preparing a solution of 0.2% wt. (2 mg/mL) $Cs_2CO_3$ in 2-ethoxyethanol, which was stirred for one hour. The solution was then placed into a spray device containing $N_2$ propellant for application onto the cathode.

Afterwards, an active layer was formed by spray coating a layer of poly-3(hexylthiophene) and [6,6]-phenyl C61-butyric acid methylester disposed on the layer of $Cs_2CO_3$, wherein the active layer was about 200 nm thick to about 500 nm thick. The active layer was optionally prepared using methods available to one of skill in the art. A useful preparation was formed by mixing a solution of poly(3-hexylthiophene) in dichlorobenzene at 20 mg/mL for 24 hours at 60° C. and a solution of 6,6-phenyl C61 butyric acid methyl ester in dichlorobenzene at 20 mg/mL for 24 hours at 60° C., in separate containers. The solution of poly(3-hexylthiophene) and solution of 6,6-phenyl C61 butyric acid methyl ester were then combined at a ratio of 1:1 and stirred for 24 hours at 60° C., followed by placing the solution into a spray device containing $N_2$ propellant for application to the inverted organic solar photovoltaic cell. In some variations of the inverted organic solar photovoltaic cell preparation, multiple light layers were sprayed first, typically as applications of 600-900 µm. A final thick continuous coat was then applied to complete the active layer coating.

The active layer was then overlaid with an anodic layer by spraying poly (3,4) ethylenedioxythiophene:poly-styrenesulfonate doped with 5 vol. % of dimethylsulfoxide on the active layer, wherein the anodic layer is about 100 nm to about 1 µm thick. The inverted organic solar photovoltaic cell was then encapsulated by applying a UV-cured epoxy encapsulant or silver paint to the edges of the cell. The anode was optionally prepared using methods available to one of skill in the art. However, a useful preparation was formed by filtering a solution of poly (3,4) ethylenedioxythiophene and poly(styrenesulfonate) through a 0.45 µm filter and mixing the filtered solution with a solution of dimethylsulfoxide to form a final concentration of dimethylsulfoxide of 5 vol %, followed by stirring the solution of poly (3,4) ethylenedioxythiophene-poly(styrenesulfonate)-dimethylsulfoxide at room temperature. The solution was then sonicated for one hour and placed into a spray device containing $N_2$ propellant for application.

The layers of the inverted organic solar photovoltaic cell were then optionally annealed together by subjecting the organic inverted solar photovoltaic cell to a vacuum of $10^{-6}$ Torr, followed by annealing the organic inverted solar photovoltaic cell at 120° C. Additionally, inverted organic solar photovoltaic cell may be subjected to a two-step annealing, including subjecting the substrate to a high vacuum at $10^{-6}$ Torr for a second hour and annealing the organic inverted solar photovoltaic cell at 160° C.

Once the layers of the inverted organic solar photovoltaic cell are prepared, which includes the application and optional annealing, the inverted organic solar photovoltaic cell is encapsulated by applying the silver paint to at least one contact on the substrate and allowing the paint to dry. An encapsulation substrate was then notched and cleaned using acetone and isopropanol. The encapsulation substrate may be any transparent material known in the art, such as the material used to form the substrate. An optional UV-ozone cleaning was then performed. The inverted organic solar photovoltaic cell and encapsulation substrate were placed into a glovebox with a UV-cure epoxy, the UV-cure epoxy to the edge of the encapsulation glass, and the inverted organic solar photovoltaic cell substrate and placing it onto the encapsulation glass. The cell was then exposed to UV-ozone.

The resulting inverted organic solar photovoltaic cell uses all solution-processable organic solar layers with transparent contacts, allowing for improved transmittal of light trough the inverted organic solar photovoltaic cell. Current power conversion efficiency of ~1.3% is achieved for a single cell with an active area of four millimeters squared (4 $mm^2$), and provides an open circuit voltage of 0.39 volts and a short circuit current of 0.46 mA.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1A:
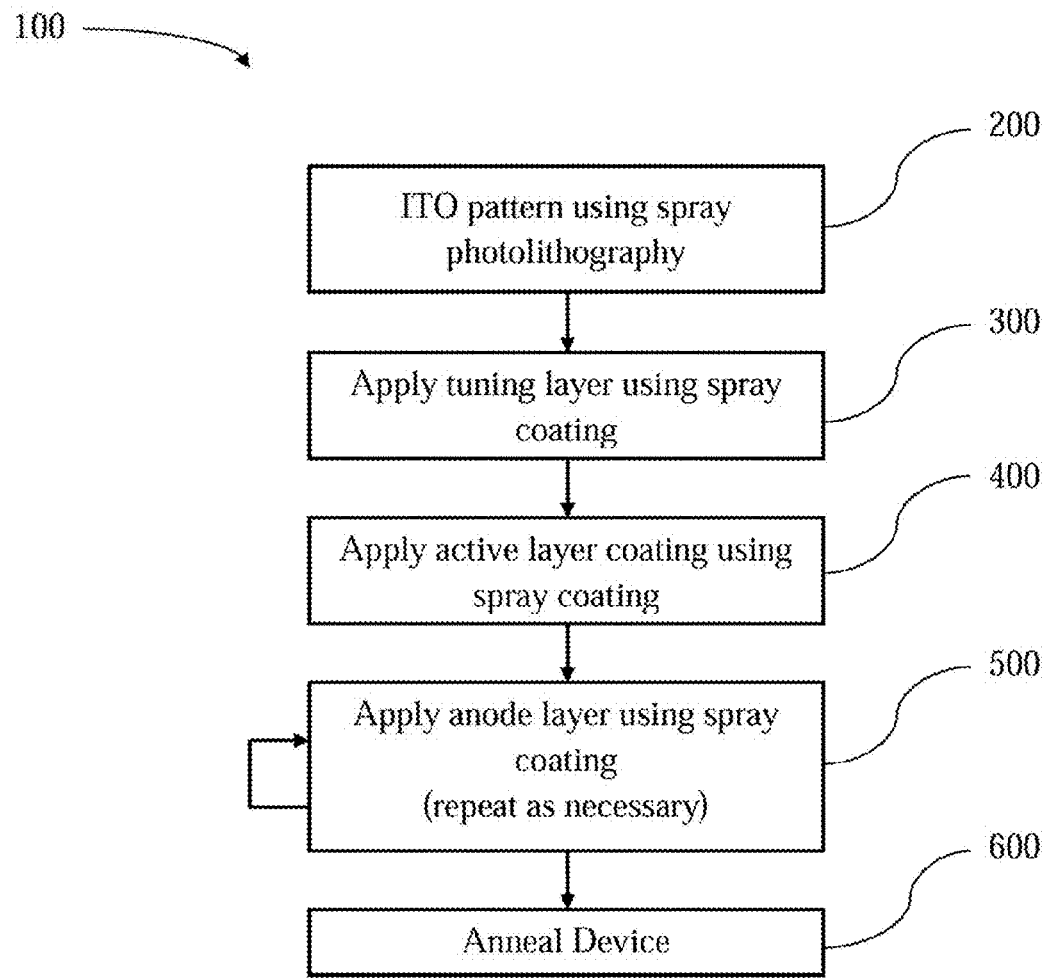
FIG. 1(A) is a flowchart of the fabrication process of an organic solar cell according to an embodiment of the present invention.

There are two different approaches in inverted geometry. One approach is completely ITO-free, using a wrap-through method by Zimmermann et. al. (Zimmermann, et al., ITO-free wrap through organic solar cells—a module concept for cost-efficient reel-to-reel production, Sol. Energy Mater. Sol. Cells 91 (2007) 374-378), or the use of a Kapton foil and an Aluminum/Chromium bi-layer system as electron contact (Manceau, et al., ITO-free flexible polymer solar cells: from small model devices to roll-to-roll processed large modules, Org. Electron. 12 (2011) 566-574), and the formation of a bottom electrode comprising silver nanoparticles on a 130 µm thick polyethyleneternaphthalate (PEN) substrate by Krebs et. al. (Krebs, All solution roll-to-roll processed polymer solar cells free from indium-tin-oxide and vacuum coating steps, Org. Electron. 10 (2009) 761-768). Another approach is to add an electron transport layer onto ITO to make it function as a cathode. Inverted geometry OPVs in which the device was first built from modified ITO as cathode have been studied both in single cells (Huang, et al., A Semi-transparent plastic solar cell fabricated by a lamination process, Adv. Mater. 20 (2008) 415-419; Yu, et al., Efficient inverted solar cells using TiO2 nanotube arrays, Nanotechnology 19 (2008) 255202-255207; Li, et al., Efficient inverted polymer solar cells, Appl. Phys. Lett. 88 (2006) 253503-253506; Zou, et al., Metal grid/conducting polymer hybrid transparent electrode for inverted polymer solar cells, Appl. Phys. Lett. 96 (2010) 203301-203304; Waldauf, et al., High efficient inverted organic photovoltaics using solution based titanium oxide as electron selective contact, Appl. Phys. Lett. 89 (2006) 233517-233520; Zhou, et al., Inverted and transparent polymer solar cells prepared with vacuum-free processing, Sol. Eng. Sol. Cells 93 (2009) 497-500) and solar modules (Krebs and Norman, Using light-induced thermocleavage in a roll-to-roll process for polymer solar cells, ACS Appl. Mater. Interfaces 2 (2010) 877-887; Krebs, et al., A roll-to-roll process to flexible polymer solar cells: model studies, manufacture and operational stability studies, J. Mater. Chem. 19 (2009) 5442-5451; Krebs, et al., Large area plastic solar cell modules, Mater. Sci. Eng. B 138 (2007) 106-111).

OPV single cell utilizing spray technique has been previously reported (Weickert, et al., Spray-deposited PEDOT:PSS for inverted organic solar cells, Sol. Energy Mater. Sol. Cells 94 (2010) 2371-2374; Kim, et al., Performance optimization of polymer solar cells using electrostatically sprayed photoactive layers, Adv. Funct. Mater. 20 (2010) 3538-3546; Kim, et al., Substrate heated spray-deposition method for high efficient organic solar cell: morphology inspection, Jap. J. Appl. Phys. 49 (2010) 01800-01804). However, all these works involve either the use of high vacuum deposition, and/or spin-coating process. The present invention is the first inverted solar array fabricated by spray. Comparing with conventional technology based on spin-coating and using metal as a cathode contact, which greatly limits transparency of solar cells and posts difficulty for large scale manufacturing, the new spray technology solves these two problems simultaneously. A thin film organic solar array is fabricated employing this layer-by-layer spray technique onto desired substrates (can be rigid as well as flexible). This technology eliminates the need for high vacuum, high temperature, low production rate and high-cost manufacturing associated with current silicon and in-organic thin film photovoltaic products. Furthermore, this technology could be used on any type of substrate including cloth and plastic.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

As used herein, "about" means approximately or nearly and in the context of a numerical value or range set forth means±15% of the numerical.

As used herein, "substantially" means largely if not wholly that which is specified but so close that the difference is insignificant.

As used herein, "solvent annealing" is a process where an organic layer which has been deposited by spray coating, or other means utilizing a solvent to transfer the organic layer substituents to the organic photovoltaic cell, is permitted to solidify at a controlled and slow rate to enhance the self-organization of the substituents in the polymer film. Such annealing may be achieved by dissolving the organic polymer(s) in a high boiling solvent, like dichlorobenzene, trichlorobenzene, or trichloroethylene, and spray coated onto the photovoltaic. The layer is permitted to slowly dry, i.e. the solvent to evaporate, over a predetermined solidification time, such as 20 minutes to 1 hour. Longer solidification times typically result in increased efficiency of the photovoltaic conversion.

As used herein, "thermal annealing" is a process whereby a substrate with at least one deposited layer are subjected to thermal energy, i.e. heating, by placing the substrate on a hot plate, oven, thermal lamp, or other heat source for a predetermined period of time and at a predetermined temperature. The temperature is referred to as the annealing temperature while the time period of time is referred to as the annealing time, or provided as a time with the annealing temperature.

All masks described herein for spray were custom made by Towne Technologies, Inc.

Additives may optionally be included to enhance carrier mobility, such as by adding a small amount of a poor solvent with respect to the organic layer substituent, such as an alkanedithiol or nitrobenzene, to the dominant solvent, like chlorobenzene. Such solvent mixtures have been shown to improve polymer aggregation and crystallinity in some polymer systems, thereby enhancing carrier mobility. Alternatively, one or more electrolytes and/or salts is added to the organic layer substituent blend solution, which has been shown to improve photocurrent in the polymer photovoltaic cell. Examples of salts include NaCl, $KNO_3$, $MgCl_2$, $CH_3COONa$, $HClO_3$, $CaCl_2$, $((CH_3)_3Si)_2NLi$, $NaNO_3$, $CH_3COONa$, $CuSO_4$, KCl, $Mg(NO_3)_2$, LiCl, $Na_2CO_3$, $K_2CO_3$, $CaCO_3$, $NaHCO_3$, $NH_4C_2H_3O_2$, $AgNO_3$, $NH_4NO_3$, and $FeCl_3$. Exemplary acidic electrolytes include $HClO_4$, HI, HBr, HCl, $H_2SO_4$, $HNO_3$, $HClO_3$, $HBrO_3$, $HBrO_4$, $HIO_4$, $HSbF_6$, $FSO_3HSbF_5$, $H(CHB_{11}Cl_{11})$, $FSO_3H$, and $CF_3SO_3H$. Exemplary electrolytic bases include KOH, $Ba(OH)_2$, CsOH, NaOH, $Sr(OH)_2$, $Ca(OH)_2$, RbOH, $Mg(OH)_2$, $C_6H_{14}LiN$, $NaNH_2$, NaH, $((CH_3)_3Si)_2NLi$.

The present invention includes a novel method to fabricate organic solar arrays with transparent contacts using a layer-by-layer spray technique. This provides for a balance between conductivity and transparency for the spray-on contacts.

Figure 1B:
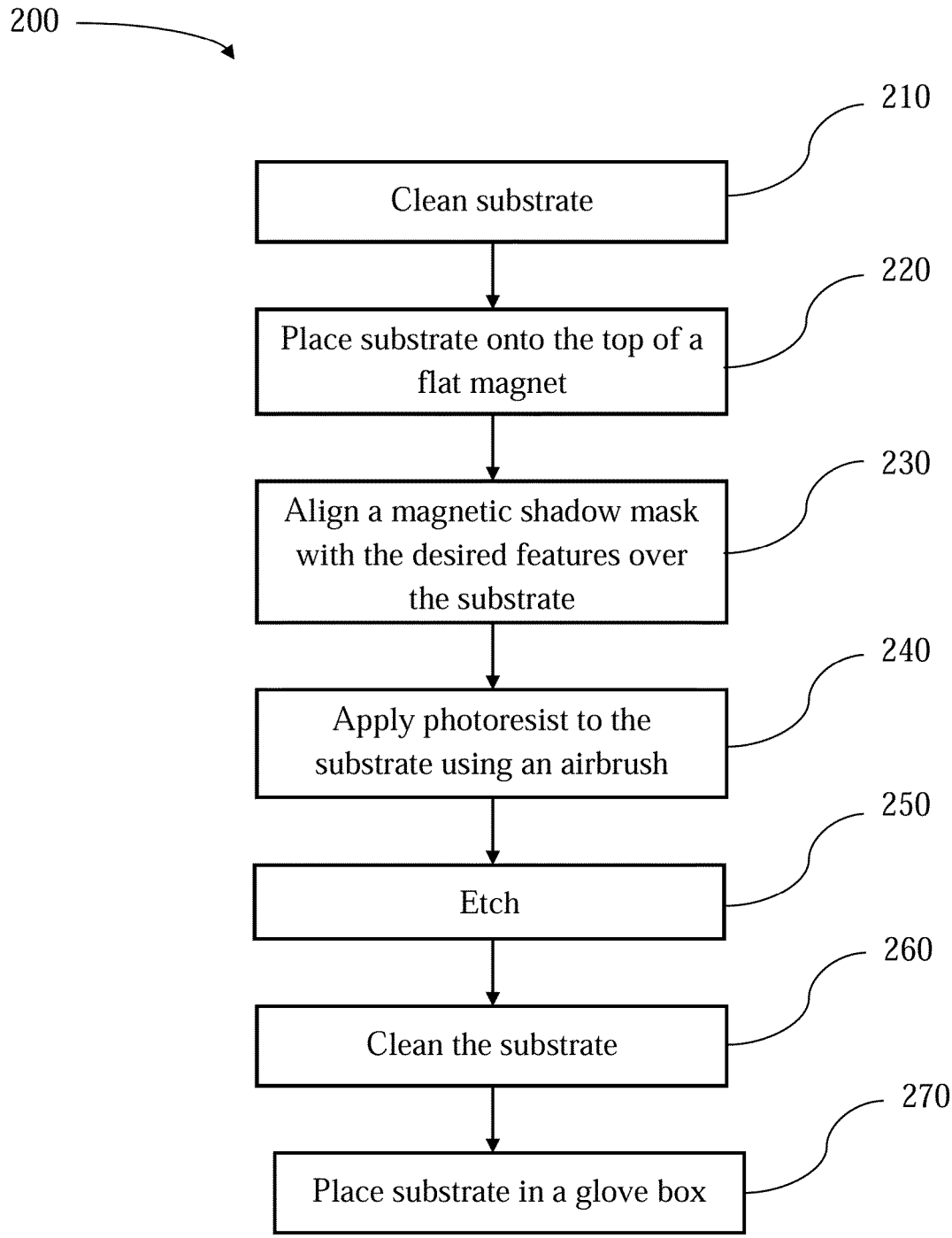
FIG. 1(B) is a flowchart of the patterning process using spray photolithography according to an embodiment of the present invention.

Fabrication of the inventive organic photovoltaic cell is shown generally in process 100, illustrated generally in the flowchart of FIG. 1(A). In operation 200, a substrate, such as a piezoelectric material, glass, cloth, or plastic, is patterned with photoresist using spray photolithography and processed to pattern a metal oxide, such as ITO, to form a cathode. In an exemplary method, seen in FIG. 1(B), the substrate is cleaned in operation 210, and placed onto a flat magnet, seen in operation 220. In operation 230, a magnetic shadow mask, which may include any desired shape, is aligned over the substrate. Next, in operation 240, photoresist is applied to the substrate using an airbrush, for example using a fine tipped airbrush and a pressure setting between 10 to 40 psi. Etching is then completed in an aqua regia solution in operation 250. Such etching may be completed in a solution of 20 HCL/7% $HNO_3$ at 90° C. to 130° C. The substrate is then cleaned, in operation 260, and placed in a glove box, in operation 270.

Figure 1C:
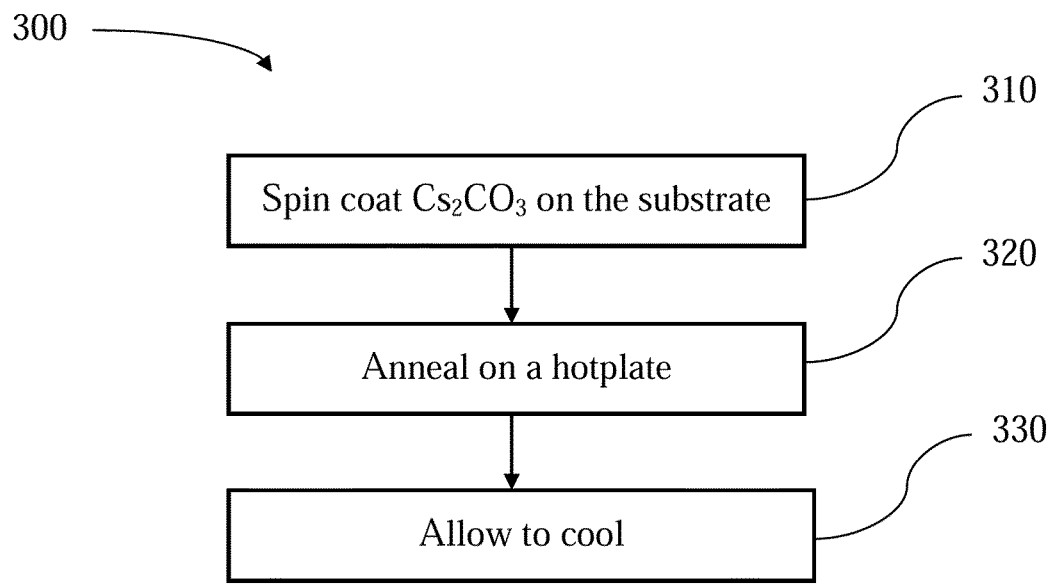
FIG. 1(C) is a flowchart illustrating the steps to add a tuning layer using spin coating according to an embodiment of the present invention.

An interstitial layer is added in operation 300 by spray coating a layer to tuning the metal oxide for efficient use as a cathode. In an exemplary method, the process to spray coat the interstitial layer is illustrated in the flowchart of FIG. 1(C). In operation 310, a layer of cesium carbonate ($Cs_2CO_3$) is applied to the patterned substrate using spray coating. Exemplary spray conditions are a pressure of 20 psi from a distance of about 7-10 centimeters. The interstitial layer may alternatively be zinc oxide (ZnO), self-assembled molecules, or anything known in the art to tune the ITO work function. The substrate is then annealed on a hotplate, in operation 320, and then allowed to cool, in operation 330. The preferable temperature of the hotplate is between 150° C. and 170° C.

Figure 1D:
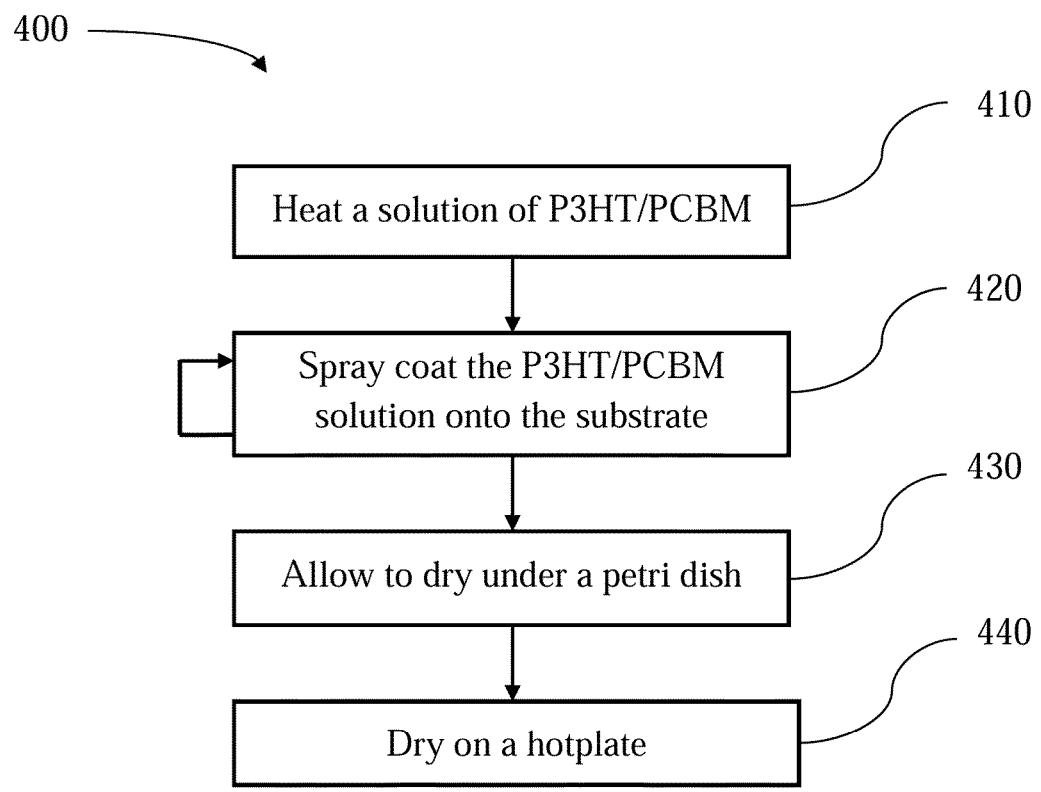
FIG. 1(D) is a flowchart illustrating the steps to add an active layer using spin coating according to an embodiment of the present invention.

An active layer is added in operation 400, seen in FIG. 1(D). The active layer substituents are heated in solution in operation 410 and spray coated onto the substrate in operation 420. For example, in operation 410, a solution of P3HT/PCBM in dichlorobenzene at a predetermined concentration, such as 10 to 20 mg/mL, is heated, such as to at 50° C. to 60° C. for about 24 hours. Operation 420 is optionally performed at 30 psi with the airbrush was set at about 7-10 cm away from the substrate. Multiple light layers of the active layer may be sprayed onto the substrate until a final thickness is reached, with each layer permitted to dry before the next layer is applied. The substrate is then allowed to dry under a petri dish. This process may take about 12 to 24 hours. Alternatively, the substrate can be allowed to dry for a shorter period of time (e.g. about 30 minutes) under a petri dish, as in operation 430, and then annealed on a hotplate, as in operation 440. This will take about 10 minutes at 110° C.

Figure 1E:
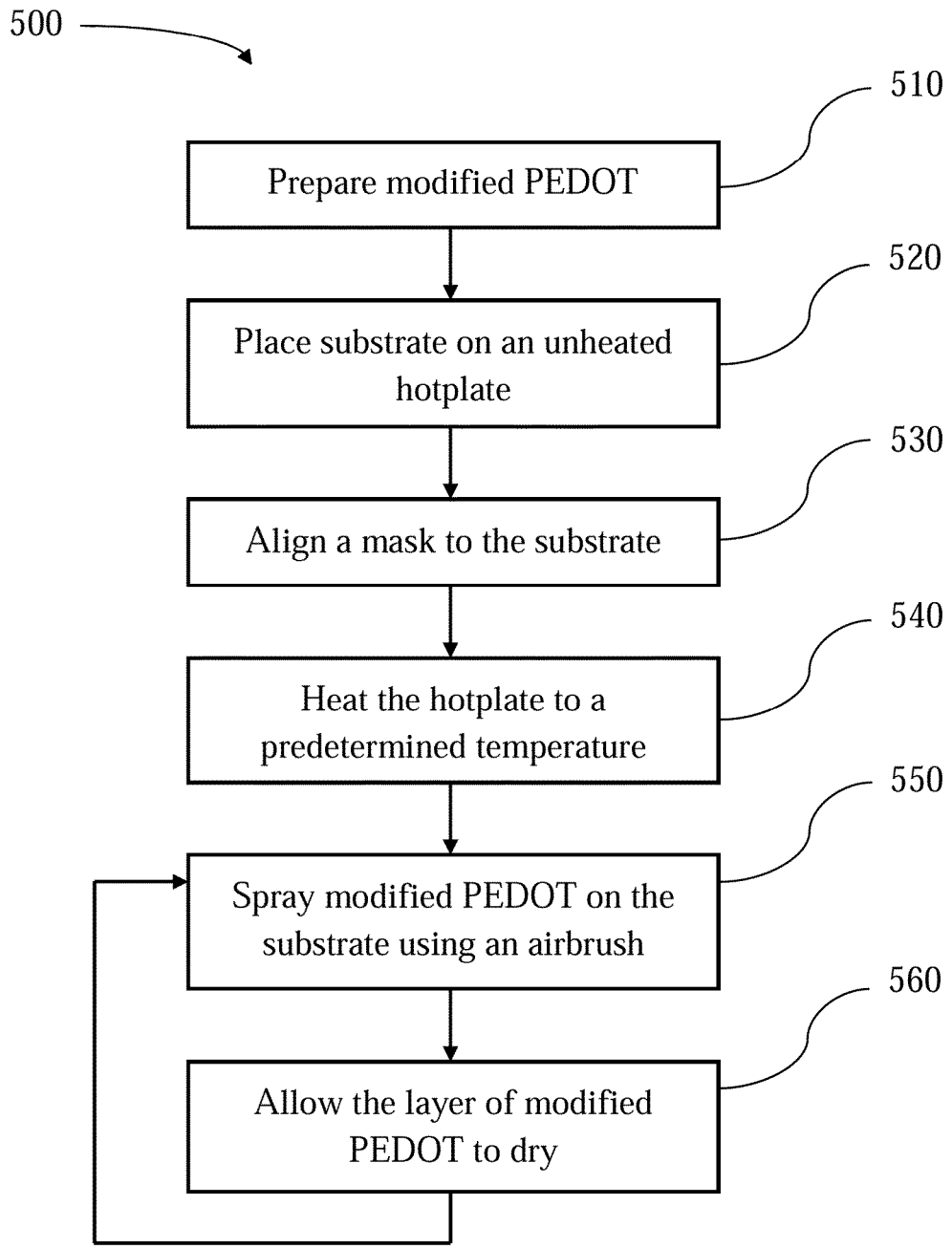
FIG. 1(E) is a flowchart illustrating the steps to add an anode layer using spray according to an embodiment of the present invention.

In operation 500, an anode layer is applied to the substrate using spray, as shown in FIG. 1(E). In order to create a semi-transparent contact and at the same time maintain acceptable contact resistance, a modified solution of PEDOT was created and used, such as a solution of PEDOT:PSS modified with 5-8% by volume DMSO. In operation 510, the modified PEDOT solution, or other anodic polymer, is prepared. In operation 520, the substrate is placed on an unheated hotplate, and, in operation 530, a mask is aligned to the substrate. Then, the hotplate is heated, in operation 540, such as heating the hotplate temperature of 90 to 100° C. In operation 550, using an airbrush, the modified PEDOT is sprayed onto the substrate. Optionally, the pressure is between 10 and 30 psi. After the modified PEDOT dries another layer can be added by spray. The modified PEDOT should be applied as very light discontinuous coats. Layers can continue to be added until the anode layer coating reaches the desired thickness. This operation is repeated, as necessary, for desired thickness. Each layer is allowed to dry before the next layer is applied. Finally, once the desired number of layers has been added, the device is annealed, in operation 600.

Example 1

An indium tin oxide (ITO) with and Corning® low alkaline earth boro-aluminosilicate glass substratehaving a nominal sheet resistance of 4-10 Ω/square (Delta Technology, Inc. Phoenix, Ariz.) was pre-cut 4"×4", and patterned using a positive photo resist, Shipley 1813, spray coated using an airbrush having a fine tip. The substrate was placed on top of a flat magnet and a magnetic shadow mask with desired features was aligned over the substrate. Shipley 1813 was spray coated using nitrogen ($N_2$) as the carrier gas, set to <10 psi, with the airbrush positioned about 7-10 cm from the substrate. However, the distance from substrate may be adjusted slightly based on the solvent used, concentration of the solution, and substrate temperature. Such modifications would be apparent to one of skill in the art. The substrate was then soft baked on a hotplate for 3 minutes at 90° C. The structure was then exposed to a UV lamp for 1.4 seconds using a constant intensity mode set to 25 watts. The structure was developed for about 2.5 minutes using Shipley MF319, rinsed with water, and hard-baked at 145° C. for 4 minutes. Any excess photoresist was cleaned off with acetone and cotton. The substrate was etched 5-11 minutes with a solution of 20% HCl and 7% $HNO_3$ on a hotplate set to 130° C., depending on solution volume. The structure was removed from etchant and cleaned using sonication in trichloroethylene (TCE), followed by a sonication cleaning in acetone followed by isopropanol at 50° C. for 20 minutes for each cleaning. The structure was further cleaned using UV-ozone for thirty minutes. The patterned substrate was then placed in a glove box.

An interstitial layer was formed on top of the patterned ITO layer. A solution of 0.2% wt. $Cs_2CO_3$ (2 mg/mL; Sigma-Aldrich Co. LLC, St. Louis, Mo.) in 2-ethoxyethanol was prepared and stirred for one hour at room temperature. $Cs_2CO_3$ was chosen to reduce ITO work function close to 4.0 eV to be utilized as cathode. The $Cs_2CO_3$ solution was sprayed onto the clean ITO substrate through a custom made shadow mask with an airbrush using $N_2$ set to 20 psi from a distance of about 7-10 centimeters. The product was then annealed for 10 minutes at 150° C. in an $N_2$ glovebox (MOD-01; M. Braun Inertgas-Systeme GmbH, Garching German).

The active layer solution was prepared by mixing separate solutions of a high molecular weight poly(3-hexylthiophene (P3HT with regioregularity over 99% and average molecular weight of 42K; Rieke Metals, Inc., Lincoln, Nebr.) and 6,6-phenyl C61 butyric acid methyl ester (PCBM, C60 with 99.5% purity; Nano-C, Inc., Westwood, Mass.) at a weight ratio of 1:1 in dichlorobenzene at 17 mg/mL and stirred on a hotplate for 27 hours at 50° C. Alternatively, the solution was prepared at a concentration of 20 mg/ml and stirred for one hour at 55° C. The active coating was then spray coated onto the $Cs_2CO_3$ coated substrate using an airbrush with $N_2$ set to 30 psi. The airbrush was set at about 7-10 cm away from the substrate and multiple light layers of active layer were sprayed, resulting in a layer thickness of about 200 to about 300 nm. The device is then left to dry under a petri dish for 30 minutes for at least 12 hours. After drying, the device was thermally annealed on a hotplate at 110° C. for 10 minutes.

The anode was prepared using an aqueous poly (3,4) ethylenedioxythiophene:poly-styrenesulfonate (PEDOT:PSS, Baytron 500 and 750; H. C. Starck GmbH, Goslar Germany) was diluted and filtered out through a 0.45 µm filter. This filtered solution of PEDOT:PSS is mixed with 5 vol. % of dimethylsulfoxide to increase conductivity (Lim, et al., Spray-deposited poly(3,4-ethylenedioxythiophene): poly(styrenesulfonate) top electrode for organic solar cells. *Appl. Phys. Lett.* 2008, 93, 193301). The solution was then stirred at room temperature followed by 10 minute sonification at 50° C. The m-PED coating was prepared by placing a substrate/mask on a hotplate (95° C.). A kovar shadow mask was aligned in position with the substrate and held in place by placing a magnet underneath the substrate. The series connection locations were wiped using a wooden dowel to expose the anode for later electrical connection. The m-PED layer was spray coated using nitrogen ($N_2$) as the carrier gas, set to 20 psi, with the airbrush positioned about 3-7 cm from the substrate and moving the airbrush at a constant steady speed. Multiple light layers were applied, allowing each layer to dry before the next layer was applied, until the final thickness of about 500 nm was reached. Not allowing the each layer to dry may cause the material to stick to itself and not the active layer resulting in a very rough surface morphology. The substrate was then removed from the hotplate and the mask removed. Care was taken to avoid removing the mPED with the mask. The substrate was placed into high vacuum treatment ($10^{-6}$ Torr) for 1 h, followed by a substrate annealing at 120-160° C. for 10 min.

The finished device was placed into high vacuum ($10^{-6}$ Torr) for 1 h. This step was shown to improve the device performance with sprayed active layer (Lim, et al., Spray-deposited poly(3,4-ethylenedioxythiophene): poly(styrenesulfonate) top electrode for organic solar cells. *Appl. Phys. Lett.* 2008, 93, 193301). The final device was annealed at various conditions, including 120° C., 160° C., and step step annealing comprising 120° C. for 10 minutes followed by high vacuum for 1 hour and annealing at 160° C. for 10 minutes. The annealed device was encapsulated using a UV-cured encapsulant (EPO-TEK OG142-12; Epoxy Technology, Inc., Billerica, Mass.) was applied to the edge of the encapsulation glass, and the glass is placed into the glovebox for at least 15 min, with UV exposure. The device was then flipped upside down, and the epoxy applied on top of the encapsulation glass. The device was finally exposed to 15 min of UV to cure the encapsulant epoxy.

Example 2

Figure 2A:
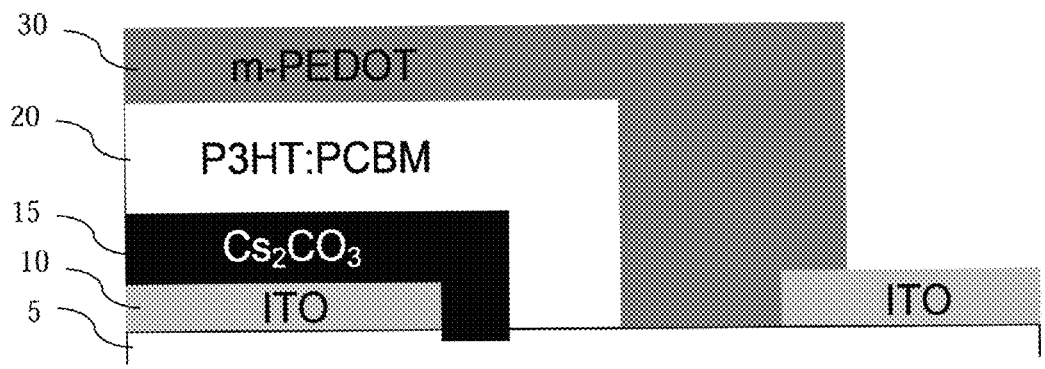
FIG. 2(A) is a diagram showing the cross sectional view of the device architecture of an inverted solar cell showing series connection.

ITO glass substrates with a nominal sheet resistance of 4-10 Ω/square and Corning® low alkaline earth boro-aluminosilicate glass (Delta Technology, Inc., Tallahassee, Fla.), hereinafter substrate 5, were pre-cut 4"×4" and cathode 10, also known as cathode layer, patterned as described in Example 1. As seen in FIG. 2(a), interstitial layer 15 was spray coated on top of patterned cathode layer 10 using a solution of 0.2% wt. $Cs_2CO_3$ (2 mg/mL; Sigma-Aldrich Co. LLC, St. Louis, Mo.) in 2-ethoxyethanol was prepared, as described above. Active layer 20 was prepared using a solution poly(3-hexylthiophene (Rieke Metals, Inc., Lincoln, Nebr.) and 6,6-phenyl C61 butyric acid methyl ester (Nano-C, Inc., Westwood, Mass.) at a weight ratio of 1:1 in dichlorobenzene and spray coated onto the $Cs_2CO_3$ coated substrate using an airbrush with $N_2$ set to 30 psi, as described in Example 1.

Anode 30 was spray coated using aqueous, filtered solution of PEDOT:PSS mixed with 5 vol. % of dimethylsulfoxide to increase conductivity using the conditions disclosed in Example 1. Multiple light layers were applied, allowing each layer to dry before the next layer was applied, until the final thickness of about 500 nm was reached. The substrate was then removed from the hotplate and the mask removed. Care was taken to avoid removing the mPED with the mask.

Figure 2B:
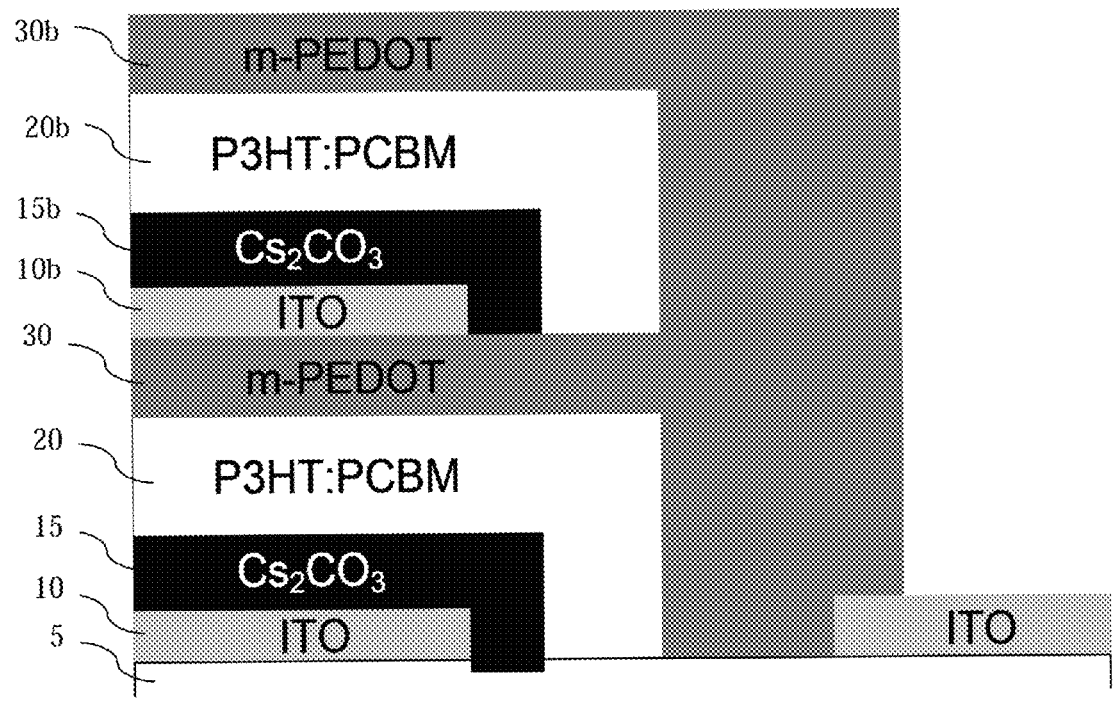
FIG. 2(B) is a diagram showing the cross sectional view of the device architecture of an inverted solar cell showing multiple cells stacked.

A second organic photovoltaic cell is optionally then built onto the first organic photovoltaic cell, as seen in FIG. 2(b). Second cathode 10b, comprised of ITO, is sprayed onto the first organic photovoltaic cell anode and the ITO layer etched as disclosed in Example 1. Briefly, a substrate is placed on a flat magnet and a magnetic shadow mask is aligned, followed by application of photoresist using an airbrush with a fine tip and a pressure setting between 10 to 40 psi is preferred. Etching is then completed in an aqua regia solution (20 HCL/7% $HNO_3$) at 90° C. to 130° C. Alternatively, the second ITO layer is applied through a magnetic shadow mask, negating the need for etching. The substrate is then cleaned, as disclosed above, and placed in a glove box for thermal annealing.

Second interstitial layer 15b, of cesium carbonate, is spray coated onto the patterned ITO and annealed on a hotplate at between 150° C. and 170° C. Second active layer 20b is spray coated using a heated solution of P3HT/PCBM in dichlorobenzene. The solution preferably has a concentration of 10 to 20 mg/mL and is heated at 50° C. to 60° C. for about 24 hours. The device is dried under a petri dish for about 12 to 24 hours, or dried for an abbreviated time and annealed on a hotplate for about 10 minutes at 110° C.

Second anode layer 30b is spray coated using a solution of PEDOT:PSS with 5-8% by volume DMSO, as disclosed above. The inverted organic photovoltaic cell is placed on a hotplate, and, a mask is aligned to the substrate. The inverted organic photovoltaic cell is heated to 90 to 100° C. and the modified PEDOT solution sprayed using an airbrush at between 10 and 30 psi using light layers until the desired thickness is attained. The substrate was placed into high vacuum treatment ($10^{-6}$ Torr) for 1 h, followed by a substrate annealing at 120-160° C. for 10 min.

Example 3

Figure 3:
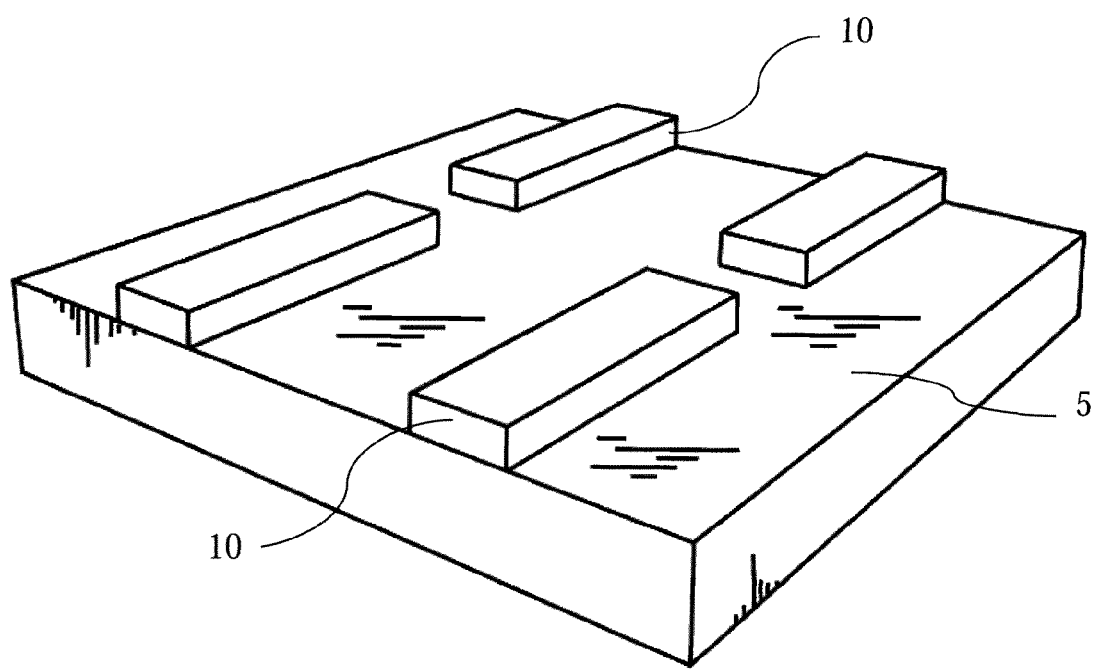
FIG. 3 is isometric view of an embodiment of the inverted organic photovoltaic cell containing a sprayed-on, patterned anodic layer.
Figure 4:
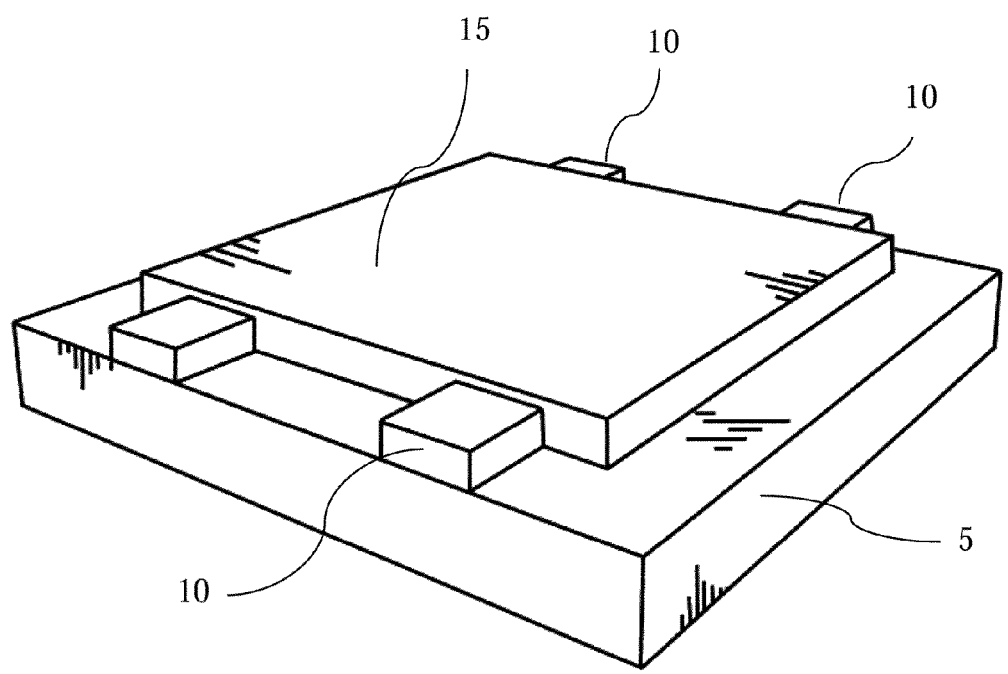
FIG. 4 is an isometric view of the inverted organic photovoltaic cell containing the anodic layer and a sprayed-on interstitial layer.
Figure 5:
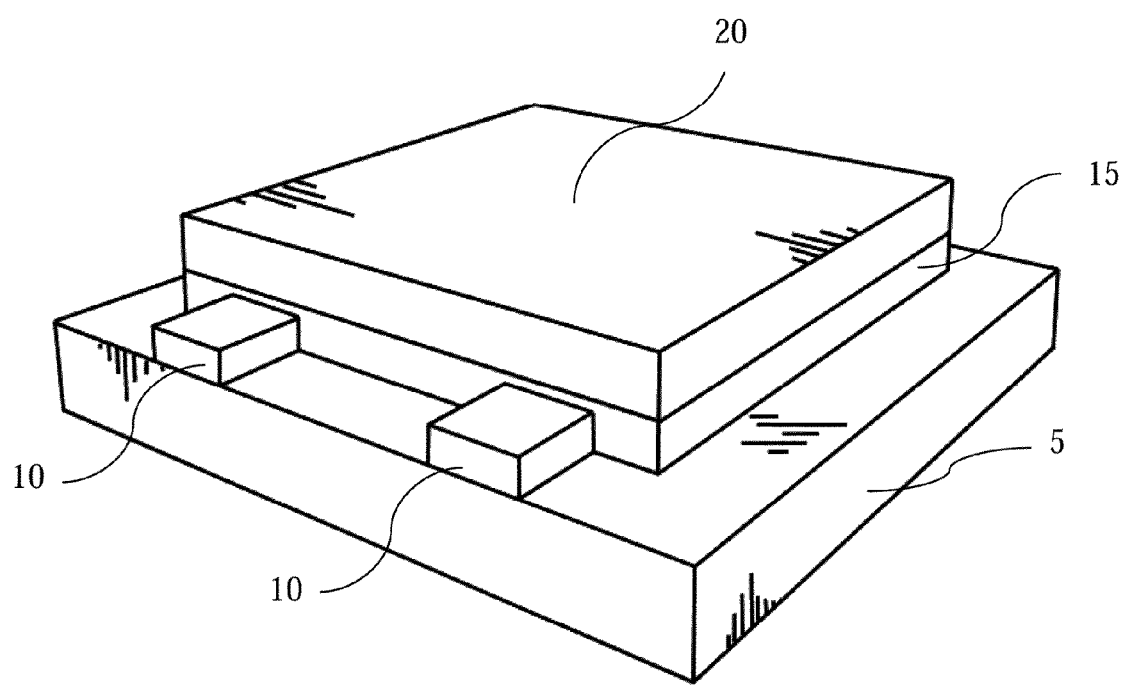
FIG. 5 is an isometric view of the inverted organic photovoltaic cell containing the anodic layer, interstitial layer, and a sprayed-on active layer.
Figure 6:
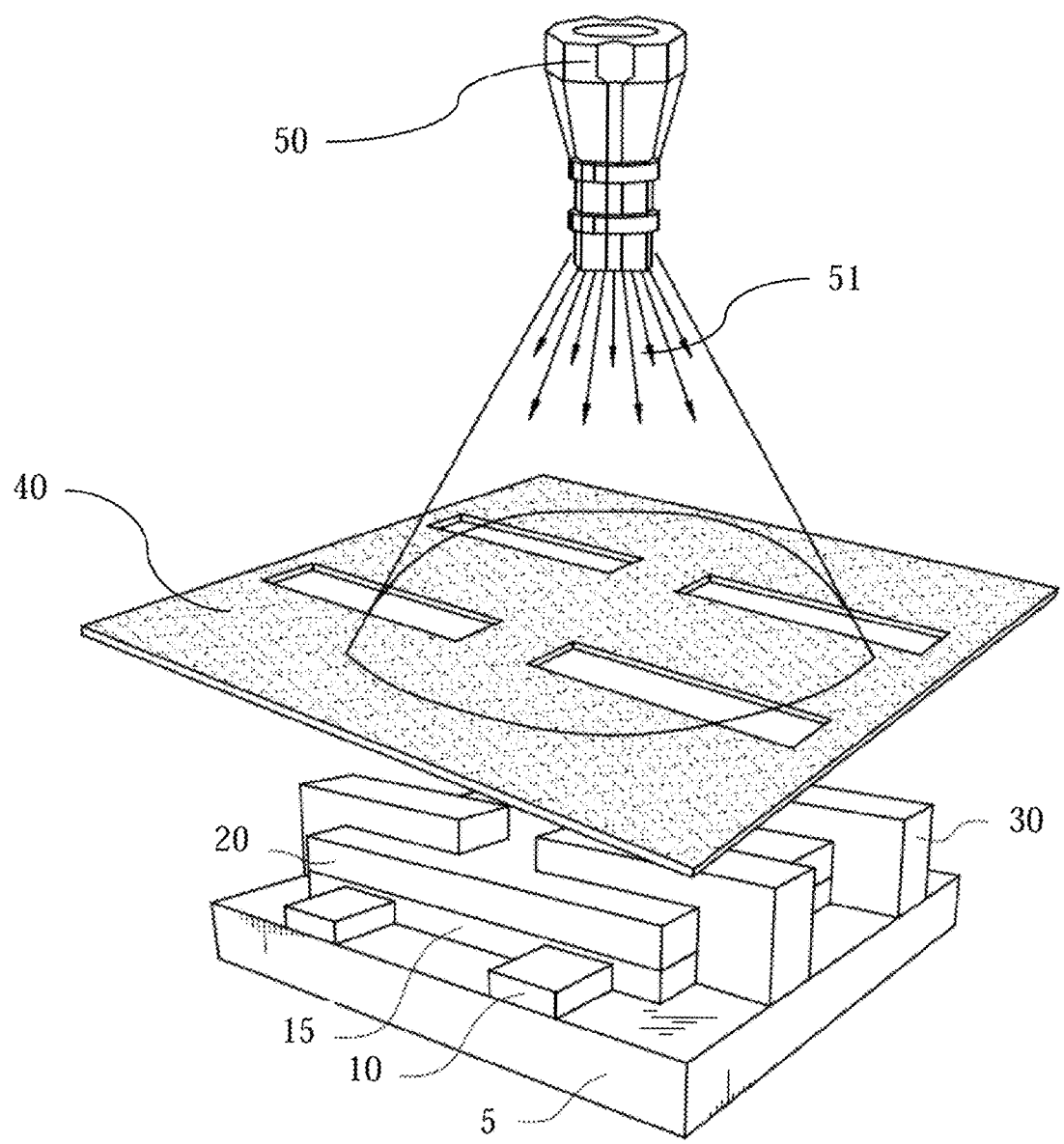
FIG. 6 is an isometric view of the modified PEDOT:PSS as it is sprayed onto the substrate through a stainless steel shadow mask with an airbrush. Nitrogen is used as the carrier gas at a pressure of 20 psi.
Figure 7:
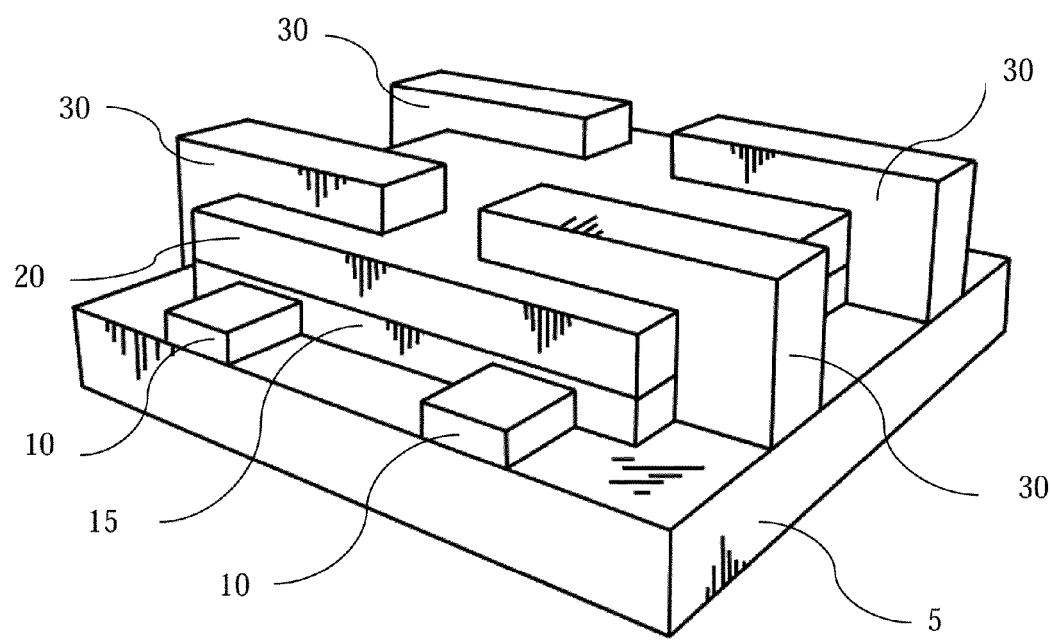
FIG. 7 is an isometric diagram showing the inverted organic photovoltaic cell.

Inverted organic photovoltaic cell 1 was created using the method described in Example 1, using substrate 5, a pre-cut 4"×4" ITO glass substrates with a nominal sheet resistance of 4-10 Ω/square and Corning® low alkaline earth boro-aluminosilicate glass (Delta Technology, Inc., Tallahassee, Fla.). Cathode 10, comprised of ITO in the present example, was sprayed onto substrate 5 forming a '||' pattern extending from a first set of edges of substrate 5, as seen in FIG. 3. Interstitial layer 15 was sprayed onto cathode 10, except for the outermost edges, as seen in FIG. 4, and permits ITO to be used as a cathode, as discussed in Example 1. Active layer 20 was sprayed directly on top of interfacial buffer layer 15, seen in FIG. 5, and was prepared using poly(3-hexylthiophene) and 6,6-phenyl C61 butyric acid methyl ester. The active layer were chosen to provide a gradient for charges crossing the interface, approximating a conventional p-n junction with organic semiconductors, thereby providing an increased efficiency of heterojunctions. Anode layer 30 was prepared using mask 40 disposed on the active layer in a pattern, similar to the cathode, but perpendicular to the cathode, as seen in FIG. 6. Airbrush 50 was set PRESURE t provide spray flow 51. The active layer were chosen to provide a gradient for charges crossing the interface, approximating a conventional p-n junction with organic semiconductors, thereby providing an increased efficiency of heterojunctions. Exemplary anode materials include PEDOT:PSS doped with dimethylsulfoxide. The fully encapsulated 4 μm×4 μm array, seen in FIG. 7, was found to possess over 30% transparency.

Figure 8:
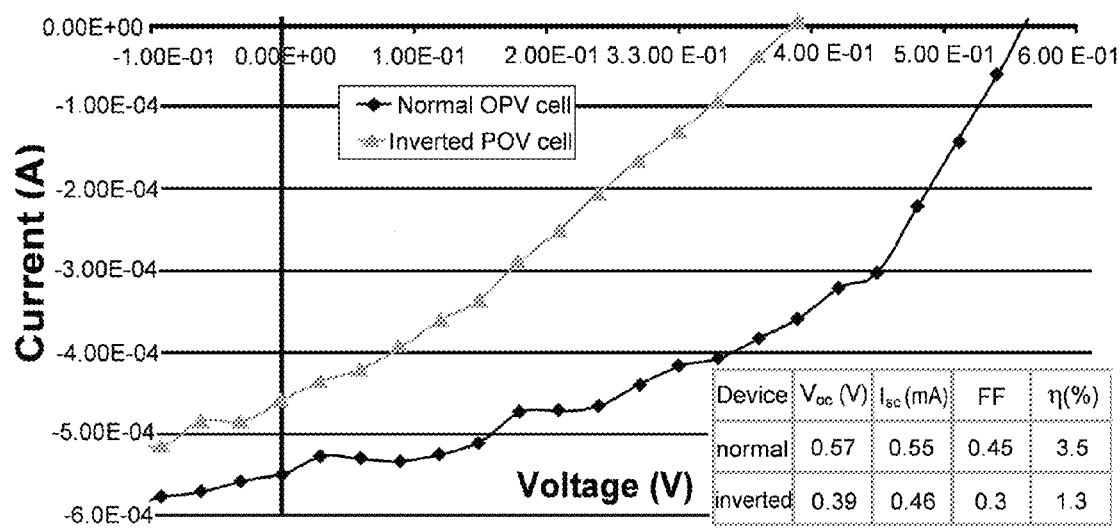
FIG. 8 is a graph comparing the voltage versus current plots of the novel inverted OPV and a control device fabricated by means of conventional bottom-up structure.

The device was analyzed against a control device fabricated by means of conventional bottom-up structure using a metal cathode by thermo evaporation. At this stage, the novel inverted cell has smaller PCE (1.3%) than that of the control device (3.5%), as seen in FIG. 8.

Example 4

The photovoltaic cell was tested to determine its photoelectric generation. The current-voltage (I-V) characterization of the solar array was performed using a Newport 1.6 KW solar simulator under AM1.5 irradiance of 100 mW/cm². Previous testing of the interstitial $Cs_2CO_3$ layer effect on the performance of the inverted cell showed organic photovoltaic cells without $Cs_2CO_3$, i.e. having an ITO layer with active layer on top of the ITO layer, performed almost like a resistor and had negligible $V_{oc}$ (0.03 V). The lower performance was due to non-ohmic contact with the cathode, with reduced built-in electric field across the active layer. ITO normally has a work function of ~4.9 eV, and is traditionally used as an anode in typical OPV devices. There have been previous reports on tuning the work function of ITO by adding an electron transport layer such as ZnO (Zou, et al., Metal grid/conducting polymer hybrid transparent electrode for inverted polymer solar cells, Appl. Phys. Lett. 96 (2010) 203301-203304), $TiO_2$ (Huang, et al., A Semi-transparent plastic solar cell fabricated by a lamination process, Adv. Mater. 20 (2008) 415-419; Yu, et al., Efficient inverted solar cells using $TiO_2$ nanotube arrays, Nanotechnology 19 (2008) 255202-255207; Li, et al., Efficient inverted polymer solar cells, Appl. Phys. Lett. 88 (2006) 253503-253506), PEO (Zhou, et al., Inverted and transparent polymer solar cells prepared with vacuum-free processing, Sol. Eng. Sol. Cells 93 (2009) 497-500) and $Cs_2CO_3$ (Huang, et al., A Semi-transparent plastic solar cell fabricated by a lamination process, Adv. Mater. 20 (2008) 415-419; Yu, et al., Efficient inverted solar cells using $TiO_2$ nanotube arrays, Nanotechnology 19 (2008) 255202-255207; Li, et al., Efficient inverted polymer solar cells, Appl. Phys. Lett. 88 (2006) 253503-253506) in inverted OPV single cells. Previous report showed $Cs_2CO_3$ can lower the ITO work function to as low as 3.3 eV. By spray coating a solution of 2-ethoxyethanol with 0.2% $Cs_2CO_3$, a very thin layer (~10 Å) of $Cs_2CO_3$ is formed over the ITO. It was reported that a dipole layer would be created between $Cs_2CO_3$ and ITO. The dipole moment helped to reduce the work function of ITO, allowing ITO to serve as the cathode. The effective work function of a control ITO/$Cs_2CO_3$ was found to be close to 4.1 eV.

Example 5

Figure 9:
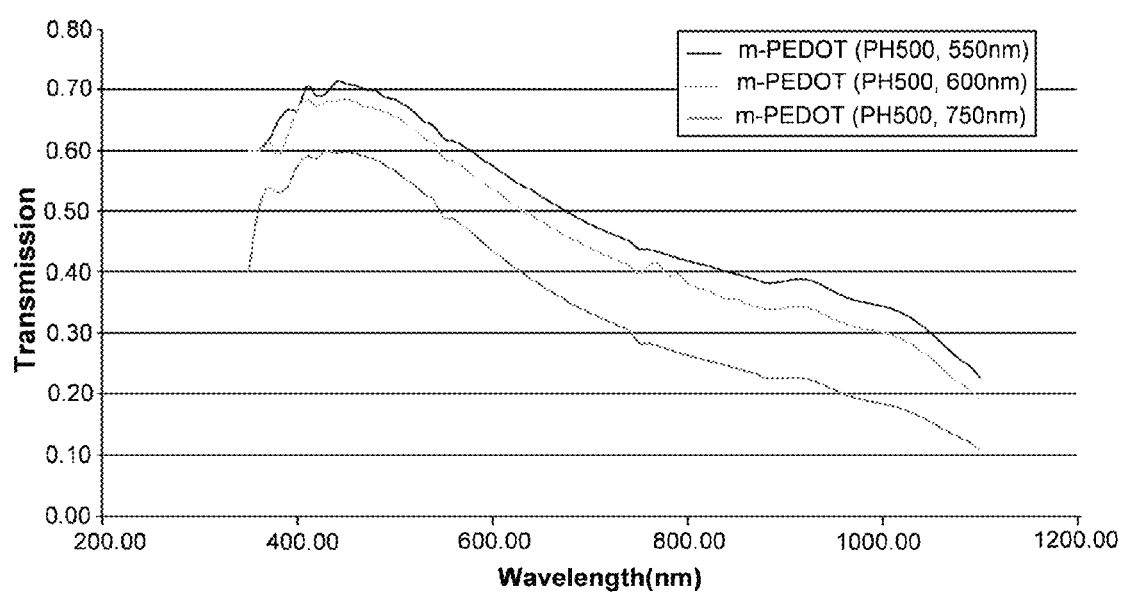
FIG. 9 is a graph showing the transmission spectra of PEDOT:PSS with 5% DMSO at different spray thickness indicated, the range of thickness from 500 nm to 1 µm, and transmittance at 550 nm 60~60%.
Figure 10:
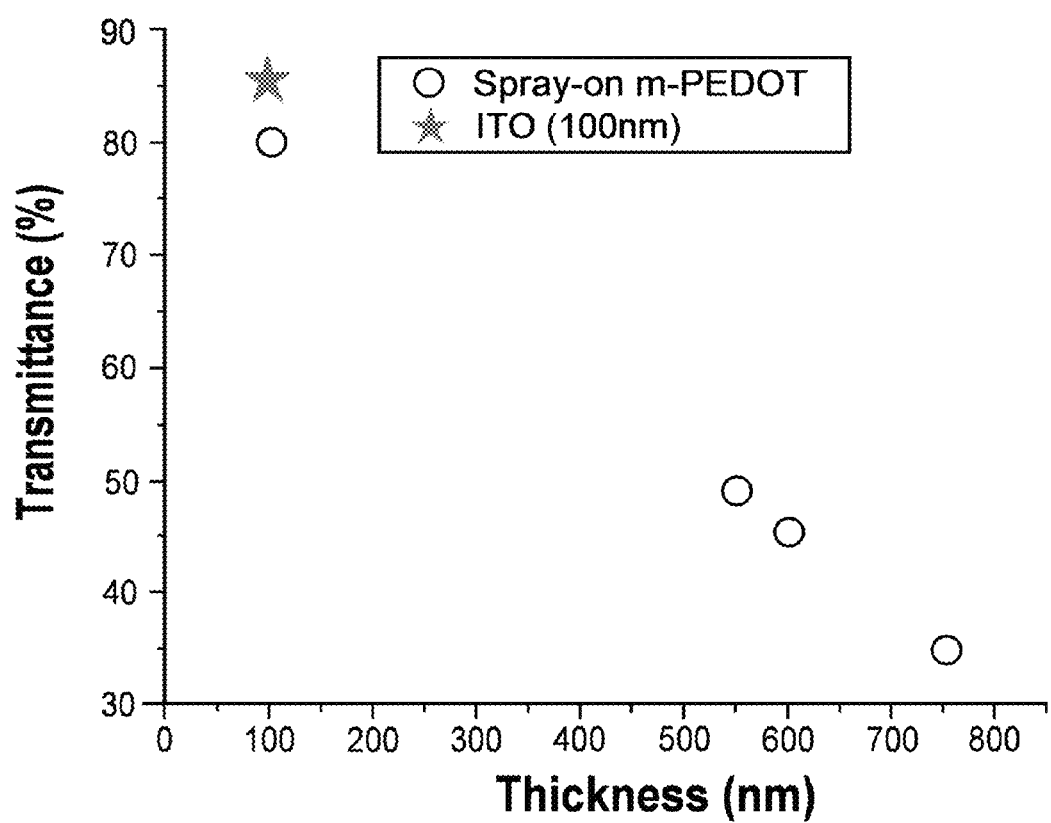
FIG. 10 is a graph showing a comparison of the transmittance between ITO and the spray-on anode of m-PEDOT (modified PEDOT:PSS) with different thicknesses.
Figure 11:
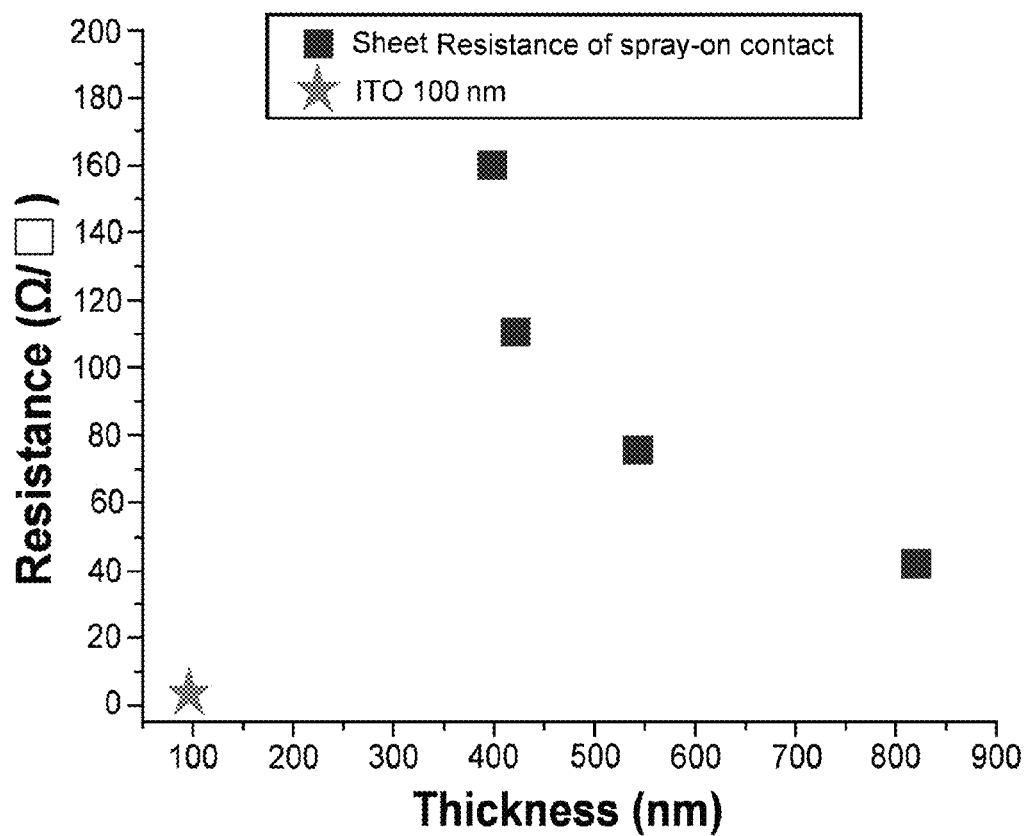
FIG. 11 is a graph showing a comparison of the sheet resistance between ITO and the spray-on anode of m-PEDOT (modified PEDOT:PSS) with different thicknesses.

Different compositions of PEDOT:PSS were analyzed to determine optimum active layer constituents. Photovoltaic cells were prepared similarly to the methods described in Example 1, with PH-500 modified 5% DMSO. The transmission spectra of the sprayed-on mPEDOT was measured for different wavelengths, using different thicknesses of active layer, as seen in FIG. 9. FIGS. 10 and 11 show how the thickness of the sprayed-on m-PEDOT layer affects its transmittance and sheet resistance. Transmittance was measured using a 250 W tungsten halogen lamp coupled with a monochromator (Newport Oriel Cornerstone ¼ m). ITO was chosen as a reference for comparison. At a thickness of about 100 nm, the transmittance of m-PEDOT is about 80%, comparable with ITO, as seen in FIG. 10. The sheet resistance of m-PEDOT was measured using a standard four-point probe measurement (Van Zant, Microchip Fabrication, McGraw-Hill, New York, ISBN 0-07-135636-3, 2000, pp. 431-2; van der Pauw, A method of measuring the resistivity and Hall coefficient on lamellae of arbitrary shape, Philips Tech. Rev. 20 (1958) 220-224). As expected, the resistance decreases as thickness increases, which is consistent with the bulk model, as seen in FIG. 11.

These two parameters (transmittance and sheet resistance) are important to assess the feasibility of m-PEDOT to be used as a replacement contact for the conventional metal contact. The trade-off between transparency and resistance is another important fabrication parameter. The current array was fabricated with thickness of about 600 nm, which has moderate resistance of 70 Ω/square, and transmittance about 50%.

Figure 12:
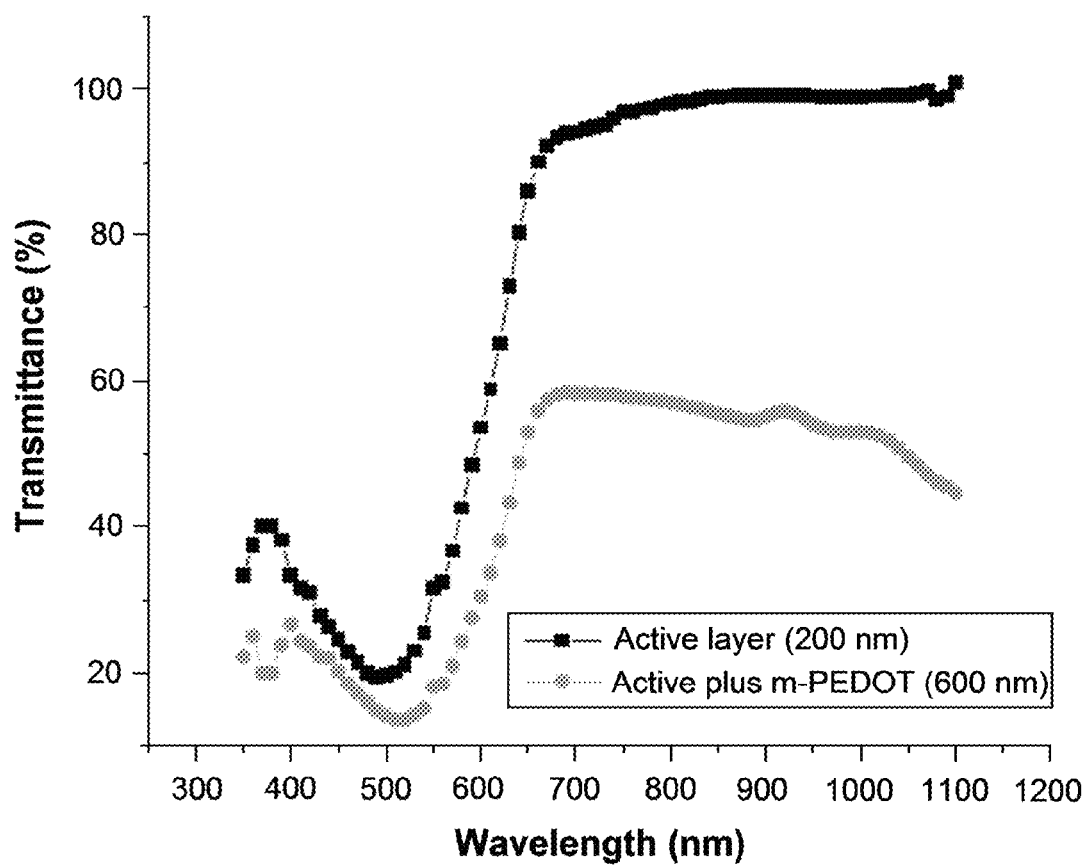
FIG. 12 is a graph showing the transmission spectra of an active layer (P3HT:PCBM) of 200 nm (black line with filled square), and with a m-PEDOT:PSS layer of 600 nm (grey line with filled circle).

The transmission spectra of the active layer (P3HT:PCBM, 200 nm) and m-PEDOT anode of 600 nm were compared, as seen in FIG. 12. The total transmittance over the spectra range shown decreases from 73% to 31% after spraying on the m-PEDOT anode.

Figure 13:
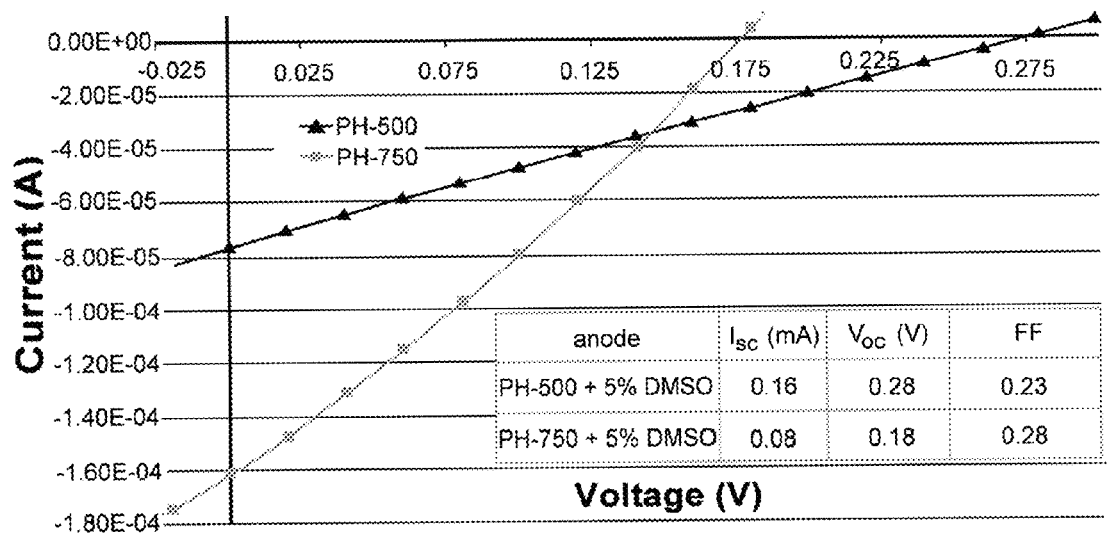
FIG. 13 is a graph showing the voltage versus current, indicating how different m-PEDOT layer compositions affect the performance of the inverted photovoltaic cell.

Photovoltaic cells were manufactured using different PEDOT compositions (PH-500 and PH-750) modified with 5% DMSO. The remaining procedures were followed as provided in Example 1, and the performance measured as disclosed above. As seen in FIG. 13, performance for PH-750 showed a strong initial current, which decreased with increasing voltage. Conversely, PH-500 performed poorly at lower voltages, but better than PH-750 at higher voltage.

Example 6

Figure 14:
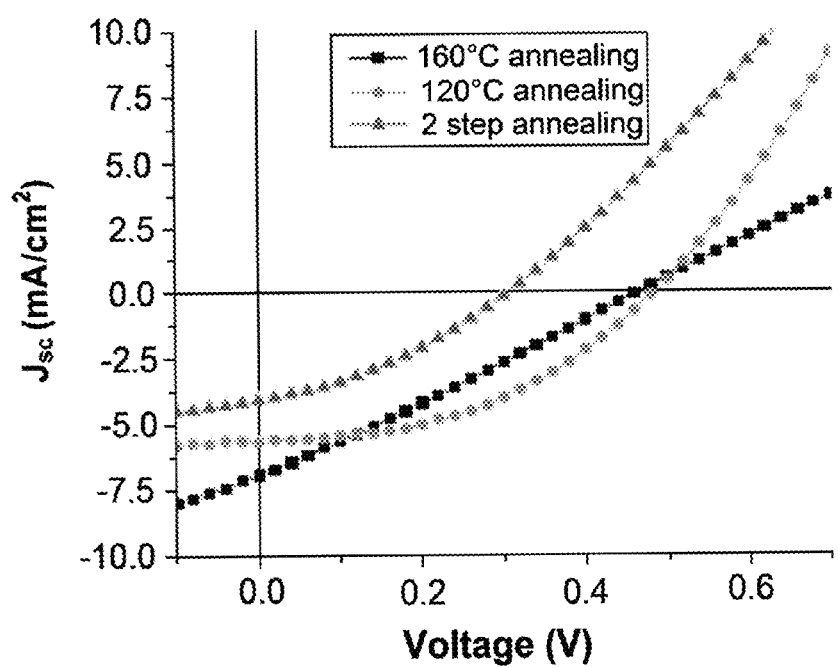
FIG. 14 is a graph showing the I-V characteristics of three test cells measured with AM 1.5 solar illumination under different annealing conditions; 1-step annealing at either 120° C. (light grey circle), or 160° C. (black filled square) for 10 min; 2-step annealing at 120° C. for 10 min, followed by high vacuum for 1 h and annealing at 160° C. for 10 min (medium grey triangle).
Figure 15:
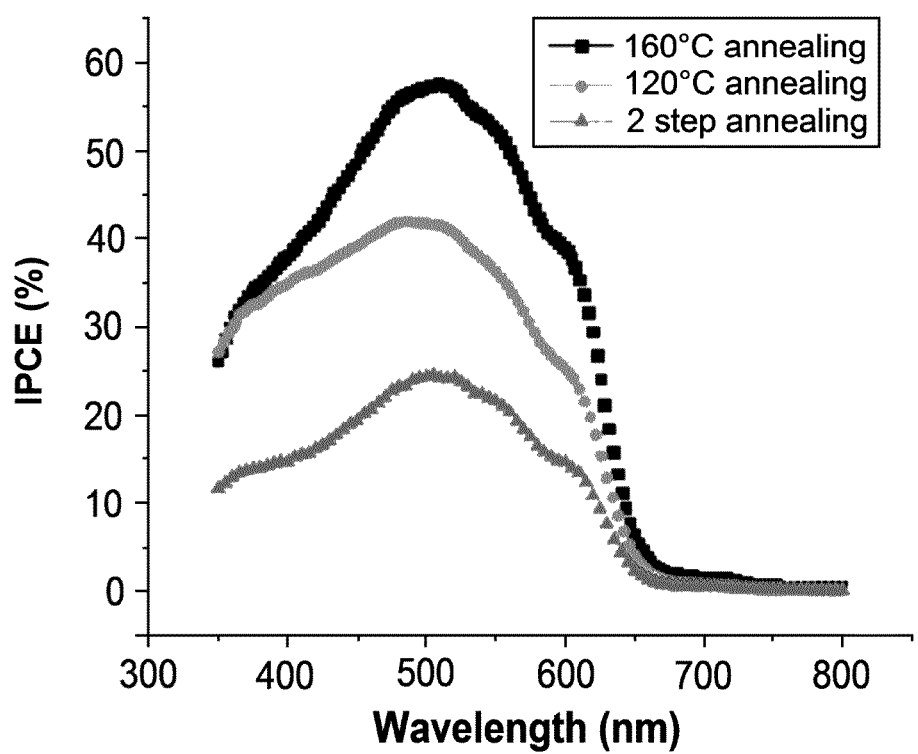
FIG. 15 is a graph showing the IPCE of the three test cells of FIG. 5a under tungsten lamp illumination. Different annealing conditions were 1-step annealing at either 120° C. (light grey circle), or 160° C. (black filled square) for 10 min; 2-step annealing at 120° C. for 10 min, followed by high vacuum for 1 h and annealing at 160° C. for 10 min (medium grey triangle).
Figure 16:
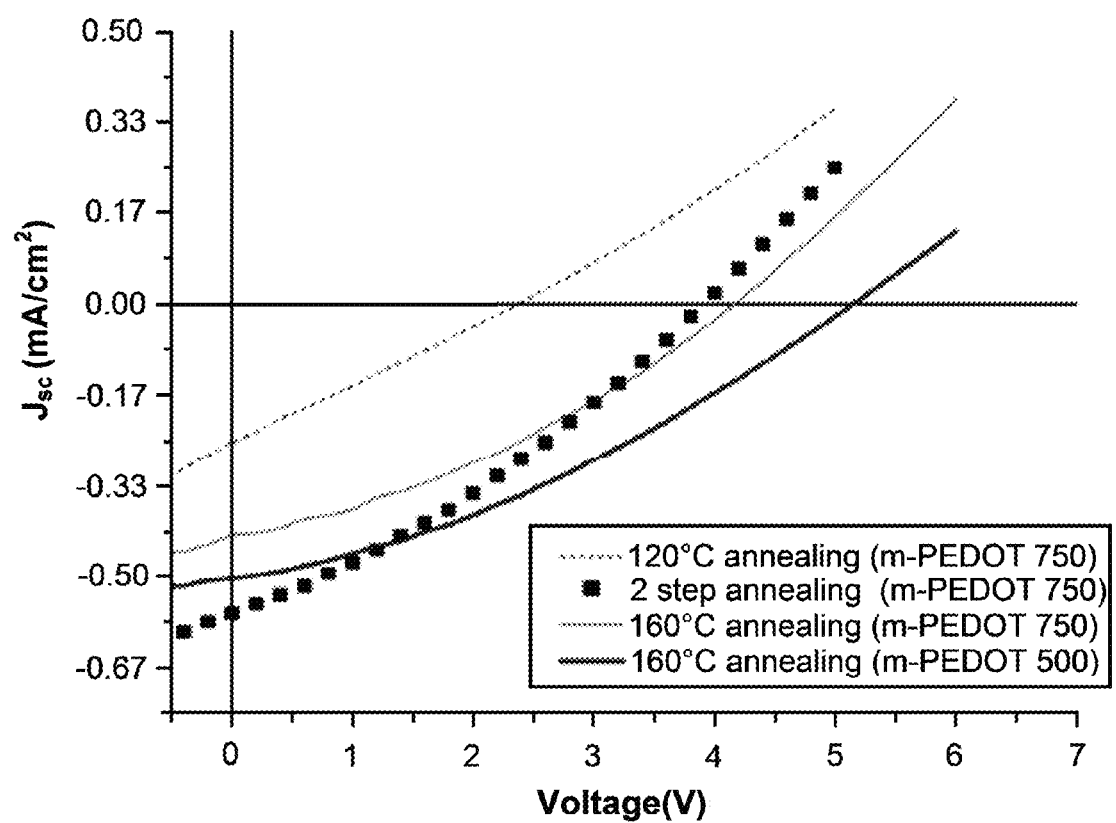
FIG. 16 is a graph showing the I-V characteristics of 4 inverted spray-on solar arrays measured with AM 1.5 solar illumination under various annealing conditions: 1-step annealing at 120° C. (dashed line), or 160° C. (thin grey line), and 2-step annealing (black filled square). These 3 arrays use m-PEDOT 750 as the anode. The 4th array (thick black line) used m-PEDOT 500 as the anode and was annealed at 160° C.

Annealing has shown to be the most important factor to improve organic solar cell performance. Photovoltaic cells were prepared as described above, except with the annealing occurring in one step at 120° C. for 10 min., one step at 160° C. for 10 min, or a two-step annealing at 120° C. for 10 min followed by high vacuum for 1 hour and then 160° C. for 10 min. FIGS. 14 and 15 show the comparison of current-voltage (I-V) and incident photon converted electron (IPCE) or external quantum efficiency (EQE) between three inverted test cells at the different annealing conditions. The rationale behind choosing such annealing conditions was to experiment both annealing temperature and the thermal profile. FIG. 14 shows that 1-step annealing at 120° C. gives the best result in test cell, with $V_{oc}$=0.48 V, $I_{sc}$=0.23 mA, FF=0.44, and a power conversion efficiency (PCE) of 1.2% under AM1.5 solar illumination with intensity 100 mW/cm². The second annealing step at 160° C. worsens the device performance, mainly due to unfavorable change of film morphology, which was confirmed in AFM images, data not shown. The PCE of 1-step annealing at 160° C. was in between 1-step annealing at 120° C. and 2-step annealing, yet the device has the worst FF, seen in FIG. 16. Table 1 listed the details of the I-V characteristics of these three test cells.

TABLE 1

Test cell I-V characteristics comparison at various annealing conditions.

| Test cell number | $I_{sc}$ (mA) | $V_{oc}$ (V) | FF | η (%) | Annealing condition |
|---|---|---|---|---|---|
| 1 | 0.28 | 0.48 | 0.26 | 0.86 | 160° C., 10 min |
| 2 | 0.23 | 0.48 | 0.44 | 1.2 | 120° C., 10 min |
| 3 | 0.16 | 0.30 | 0.35 | 0.43 | 2-step |

In FIG. 15, IPCE measurement shows 2-step annealing was worse than 1-step annealing, which was consistent with the I-V measurements, not shown. There seems to be some inconsistency between PCE and IPCE for the cells annealed at 160 and 120° C., as the cells annealed at 160° C. have higher IPCE yet lower PCE than that at 120° C. IPCE measurement was done under illumination from the Tungsten lamp, whereas I-V was done under solar simulator, which has a different spectrum than that of the tungsten lamp. Nevertheless, the integration of IPCE should be proportional to $I_{sc}$. The device made by 1-step annealing at 160° C., though having smaller power conversion efficiency, actually has larger $I_{sc}$ (0.28 mA) than the one at 120° C. (0.23 mA). The ratio between integral of IPCE at 160° C. vs. 120° C. is about 1.3, and the ratio of $I_{sc}$ of the same devices was 1.2. Without being limited to any theory, the slight discrepancy might also come from the fact that the cells behave differently under strong (IV) and weak (IPCE) illuminations. Usually bi-molecular (BM) recombination sets in under high light intensity (solar simulator) (Shaheen, et al., 2.5% efficient organic plastic solar cells, Appl. Phys. Lett. 78 (2001) 841-843), meaning the cell, which has more prominent BM recombination, will perform poorer with high intensity illumination such as that from the solar simulator. It might be that the cell annealed at 160° C. was affected by BM recombination more than the cell annealed at 120° C., due to more traps associated with rougher morphology, data not shown, serving as recombination centers. The same mechanism can also be applied to explain the larger difference in IPCE of device annealed at 160° C. and by 2-step annealing than that of their $I_{sc}$ in FIGS. 14 and 15.

1-step annealing at 120° C. (b) showed improved film roughness and the best phase segregation of P3HT and PCBM, which explains the high device performance using this annealing profile, as seen in FIGS. 14 and 15. Device by 2-step annealing has the smoothest film, however, the phase segregation was much less distinct. This indicates that P3HT chains and PCBM molecules are penetrating through each other more after the second annealing at 160° C., and form much smaller nano-domains, which are favorable for charge transport between the domains (Kline and McGehee, Morphology and charge transport in conjugated polymers, J. Macromol. Sci. C: Polym. Rev. 46 (2006) 27-45). However, recombination of photogenerated carriers might be enhanced due to the lack of separate pathways for electron sand holes, and that was why the device after 2-step annealing performed worse than after the 1st annealing at 120° C., seen in FIGS. 14 and 15. 1-step annealing at higher temperature of 160° C. results in the roughest film (even rougher than the as-made device), and the P3HT phase and PCBM phase are hardly distinguishable. This rough film also further affects the interface between active layer and m-PEDOT, resulting in poor FF of the device, seen in FIGS. 14 and 15.

Example 5

Solar illumination has been demonstrated to improve solar array efficiency up to 250%. Device efficiency of 1.80% was observed with the array under AM1.5 irradiance. Data have shown that the performance enhancement under illumination only happens with sprayed devices, not devices made by spin coating. This means that solar cells made with our spray-on technique performs better under sunlight, which is beneficial for solar energy application.

A solar array was prepared by forming 50 individual inverted cells, each with an active area of 60 mm², and using either m-PEDOT 750 or m-PEDOT 500 as the semitransparent anode. Characteristics of the arrays were tested as described above. The I-V of four arrays prepared using the different annealing conditions described in Example 4, above, were measured with AM 1.5 solar illumination. It is clear that 1-step annealing at low temperature (120° C.) gives the worst result, and 2-step annealing showed improved I-V characteristics ($V_{oc}$, $J_{sc}$, FF and PCE) after the second high temperature annealing at 160° C. 1-step annealing at high temperature (160° C.) gives the best $V_{oc}$, and 2-step annealing yields the highest $J_{sc}$. In terms of anode, m-PEDOT 500 seems to give higher Voc than PEDOT 750, as seen in Table 2. However, there is not much difference of PCE between 2-step annealing and 1-step annealing at 160° C., which is in contrast with the result of the test device, seen in FIGS. 14 and 15. It is likely the annealing duration is probably too short for the array, since it has much larger area and contains much more materials. Further investigation of interplay between annealing temperature, duration and thermal profile is ongoing to find the optimal device fabrication conditions.

TABLE 2

Array I-V characteristics comparison at various annealing conditions.

| Array number | $I_{sc}$ (mA) | $V_{oc}$ (V) | FF | η (%) | Annealing condition | m-PEDOT |
|---|---|---|---|---|---|---|
| 1 | 17.0 | 3.9 | 0.30 | 0.68 | 2-step | 750 |
| 2 | 11.5 | 4.0 | 0.39 | 0.62 | 2-step | 750 |
| 3 | 6.30 | 2.8 | 0.37 | 0.22 | 2-step | 750 |
| 4 | 13.0 | 4.0 | 0.33 | 0.56 | 160° C. 10 min | 750 |
| 5 | 15.0 | 5.2 | 0.33 | 0.86 | 160° C. 10 min | 500 |
| 6 | 12.0 | 5.8 | 0.30 | 0.70 | 160° C. 10 min | 500 |
| 7 | 11.1 | 5.2 | 0.35 | 0.67 | 160° C. 10 min | 500 |

Number of coats for spray-on active layer: 5 light layers, and 2 heavy layers
Number of coats for the spray-on PEDOT: PSS layer: 6-7 light layers, and 5 heavy layers
Number of coats for the spray-on $Cs_2CO_3$ layer: 1 light layer An interesting phenomenon was observed with the inverted organic photovoltaic cells, which is termed 'photo annealing'. Under constant illumination from the solar simulator, a sudden change in I-V characteristics occurs after time, which is device dependent, ranging from 10 min to several hours. For example, the solar array required about 15 min to 'photo anneal', and reached a maximum PCE after 2.5 h under illumination. The most drastic change occurred in the Isc, which more than doubled from 17 to 35 mA after 2.5 h. The change of $V_{oc}$ was marginal, from 4.0 to 4.2 V, and the maximum PCE of the array was 1.80%. Table 3 listed the changes of other I-V characteristics.

TABLE 3 change of array I-V characteristics under solar illumination.

| Time | $I_{sc}$ (mA) | $V_{oc}$ (V) | FF | η (%) |
|---|---|---|---|---|
| Day 1 | | | | |
| 0 min | 17 | 4.0 | 0.30 | 0.68 |
| 12 min | 28 | 4.2 | 0.35 | 1.40 |
| 150 min | 35 | 4.2 | 0.37 | 1.80 |
| Day 2 | | | | |
| 0 min | 18 | 4.2 | 0.35 | 0.88 |
| Day 3 | | | | |
| 0 min | 15 | 4.4 | 0.29 | 0.64 |
| 120 min | 27 | 4.8 | 0.38 | 1.68 |

Figure 17:
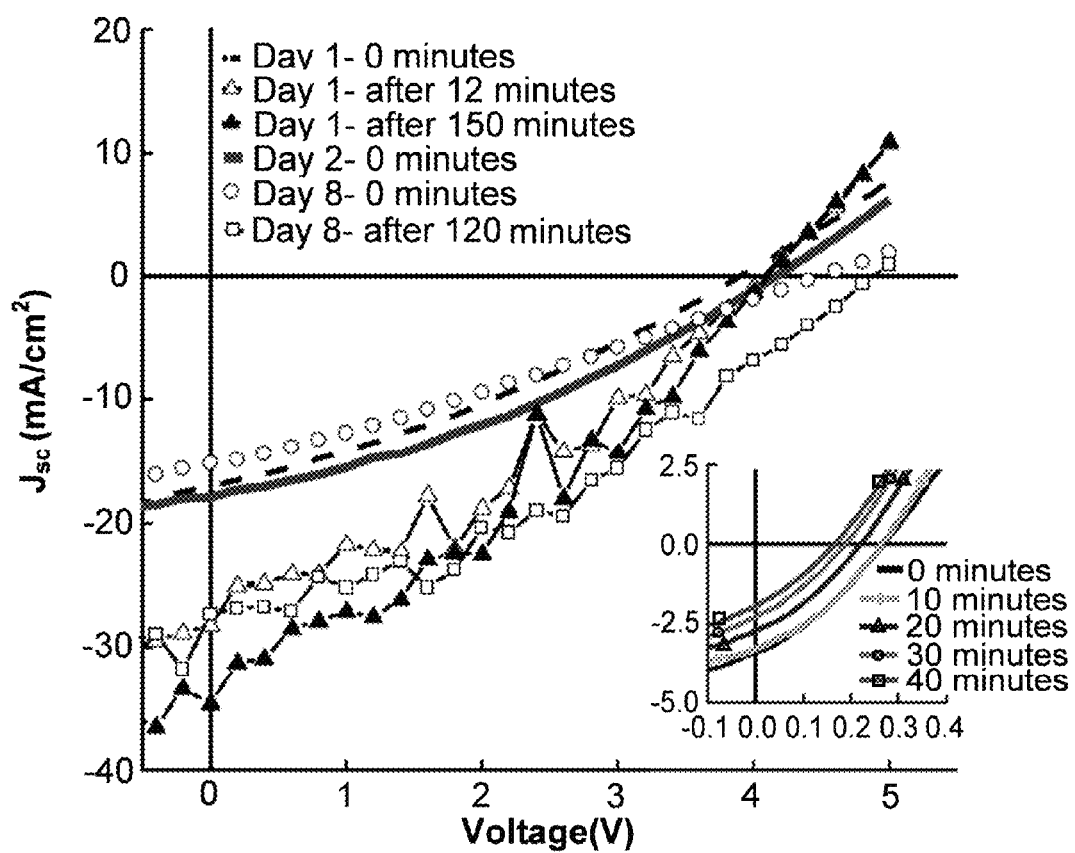
FIG. 17 is a graph showing the I-V characteristics of an inverted solar array under continuous AM 1.5 solar illumination. The first measurement (dashed black line) was done right after the array was fabricated and encapsulated. The inset shows the time dependence of I-V characteristics of a spray-on test cell (without encapsulation).

It was also noted that this sudden increase of $I_{sc}$ was accompanied by a characteristic 'wiggling' on the I-V curve, seen in FIG. 17. Without being limited to any specific theory, several mechanisms may explain these observations. The first mechanism is due to optical interference causing re-distribution of light intensity within the active layer. The sealant epoxy was heated and softened, resulting in the change of the distance between encapsulating glass and the device, causing less optical loss. As a consequence, the short circuit current $I_{sc}$ increases. This mechanism is supported by observed fast decay of a spray-on test cell without encapsulation. Encapsulation also helped to minimize oxidization and slow down the decay of organic solar cell efficiency. The second mechanism is that photo annealing of active layer improved the device morphology and cured some of the weak points (burned out shorts), thereby improving $I_{sc}$ and FF. It is also possible PCBM penetrated into the voids between polymer chains, causing better phase segregation (Geiser, et al., Poly (3-hexylthiophene)/$C_{60}$ heterojunction solar cells: implication of morphology on performance and ambipolar charge collection, Sol. Eng. Sol. Cells 92 (2008) 464-473). As temperature drops down, the polymer chains go back to its original configuration, and the I-V curve is back to its original one, manifesting certain kind of thermal hysteresis. The third mechanism is due to the thermal activation of the previous deeply trapped carriers (i.e., polarons), which results in increased photocurrent at higher temperature (Graupner, et al., Shallow and deep traps in conjugated polymers of high intrachain order, Phys. Rev. B 54 (1996) 7610-7613; Nelson, Organic photovoltaic films, Curr. Opinion Solid State Mater. Sci. 6 (2002) 87-95). The wiggling of the I-V data indicate the non-uniformity of the film morphology, and the overall boost of device performance is the result of the free-up of previously trapped charges in the active layers. This observation is against the conventional picture of organic solar cell, which normally shows degradation under solar illumination (Dennler, et al., A new encapsulation solution for flexible organic solar cells, Thin Solid Films 511-512 (2006) 349-353). Surprisingly, this performance enhancement under illumination only happened with sprayed devices, not with a device made by spin coating. As such, solar cells prepared using the spray-on technique performs better under sunlight, which is obviously beneficial for solar energy application. The thermal annealing was important in improving device PCE. Moreover, the optimal annealing conditions are not the same with small single cell and large solar array consisting of 50 cells. Systematic study of optical, electronic and morphologic properties of the device revealed the influence of nanomorphology over device power conversion efficiency. Moreover, the photo annealing, i.e., more than 2-fold increase of solar cell PCE under solar irradiance and with hysteresis pattern, is in contrary to the normal understanding of organic solar cell degradation under sunlight. The fact that photo annealing was only observed with sprayed solar cell or arrays places an advantageous solution to for large scale, low-cost solution-based solar energy applications.

In the preceding specification, all documents, acts, or information disclosed do not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A method for fabricating an organic inverted solar photovoltaic cell, comprising the steps of:
    obtaining a substrate comprising a substrate coated with indium tin oxide;
    applying photoresist to a substrate by spray photolithography;
    forming an interstitial layer by spray coating a layer on the indium tin oxide coating;
    forming an active layer by spray coating a layer of poly-3 (hexylthiophene) and [6,6]-phenyl C61-butyric acid methylester disposed on the interstitial layer, wherein the active layer is formed using multiple light layers of poly-3(hexylthiophene) and [6,6]-phenyl C61-butyric acid methylester, wherein each layer is permitted to dry before spraying the subsequent layer;
    forming an anodic layer by spray coating a layer comprising poly (3,4) ethylenedioxythiophene:poly-styrenesulfonate doped with 5 vol. % of dimethylsulfoxide, wherein the anodic layer is disposed on the active layer, and wherein the anodic layer is formed using multiple light layers of poly (3,4) ethylenedioxythiophene:polystyrenesulfonate doped with 5 vol. % of dimethylsulfoxide, wherein each layer is permitted to dry before spraying the subsequent layer; and
    annealing the layers on the substrate.

2. The method of claim 1, wherein the interstitial layer is cesium carbonate, zinc oxide (ZnO), or self-assembled molecules.

3. The method of claim 1, wherein the active layer is about 200 nm thick to about 500 nm thick.

4. The method of claim 1, wherein the anodic layer is about 100 nm to about 1.26 µm thick.

5. The method of claim 4, wherein the anodic layer is about 500 nm thick, about 1 µm thick, 100 nm thick, 500 nm thick, or 1 µm thick.

6. The method of claim 1, further comprising encapsulating the organic inverted photovoltaic cell by applying a UV-cured epoxy encapsulant or silver paint to the edges of the cell.

7. The method of claim 1, wherein the substrate is a piezoelectric material, ITO glass, plastic, or cloth.

8. The method of claim 1, further comprising:
cleaning the substrate with acetone and isopropanol prior to applying the photoresist.

9. The method of claim 1, further comprising:
etching the substrate, following application of the photoresist; and
cleaning the etched substrate.

10. The method of claim 9, wherein etching is completed using a solution of 20% HCl/7% $HNO_3$ at about 130° C.

11. The method of claim 9, wherein cleaning the etched substrate comprises:
sonicating the etched substrate in at least one cleaning solution; and
ozone cleaning the etched substrate.

12. The method of claim 11, wherein sonicating step further comprises:
sonicating the etched substrate with trichloroethylene at about 50° C. for about twenty minutes;
sonicating the etched substrate with acetone at about 50° C. for about twenty minutes; and
sonicating the etched substrate with isopropanol at about 50° C. for about twenty minutes.

13. The method of claim 1, further comprising:
thermal annealing the substrate on a hotplate at about 130° C. for about twenty minutes, following the application of the interstitial layer.

14. The method of claim 1, further comprising:
allowing the substrate to dry under a petri dish for about thirty minutes, and drying the substrate on a hotplate at about 110° C. for about ten minutes, following the application of the active layer.

15. The method of claim 1, wherein the layer comprising poly (3,4) ethylenedioxythiophene:poly-styrenesulfonate doped with 5 vol. % of dimethylsulfoxide, is formed from a modified PEDOT solution prepared by adding 5% of DMSO by volume to a solution of undiluted poly (3,4) ethylenedioxythiophene:poly-styrenesulfonate.

16. The method of claim 1, wherein spray coating is completed using an airbrush having a pressure setting of between 10 and 30 psi.

17. The method of claim 1, wherein spray coating is completed while the substrate is on a hotplate heated to between 90° C. and 100° C.

18. The method of claim 15, wherein spray coating the substrate with the modified PEDOT solution is repeated and each layer of the modified PEDOT solution is allowed to dry before the next layer is applied.

19. The method of claim 1, further comprising:
wherein the annealing step is performed at about 120° C. for twenty minutes following the anodic layer spray coating.

20. The method of claim 1, further comprising dissolving at least one constituent of the indium tin oxide coating, active layer, interstitial layer, anodic layer or a combination thereof with alkanedithiol in chlorobenzene, nitrobenzene in chlorobenzene, or one or more electrolytes;
wherein the one or more electrolytes is NaCl, KNOB, $MgCl_2$, $CH_3COONa$, $HClO_3$, $CaCl_2$, $((CH_3)_3Si)_2NLi$, $NaNO_3$, $CH_3COONa$, $CuSO_4$, KCl, $Mg(NO_3)_2$, LiCl, $Na_2CO_3$, $K_2CO_3$, $CaCO_3$, $NaHCO_3$, $NH_4C_2H_3O_2$, $AgNO_3$, $NH_4NO_3$, $FeCl_3$, $HClO_4$, HI, HBr, HCl, $H_2SO_4$, $HNO_3$, $HClO_3$, $HBrO_3$, $HBrO_4$, $HIO_4$, $HSbF_6$, $FSO_3HSbF_5$, $H(CHB_{11}Cl_{11})$, $FSO_3H$, $CF_3SO_3H$, KOH, $Ba(OH)_2$, CsOH, NaOH, $Sr(OH)_2$, $Ca(OH)_2$, RbOH, $Mg(OH)_2$, $C_6H_{14}LiN$, $NaNH_2$, NaH, $((CH_3)_3Si)_2NLi$, or a combination thereof.

* * * * *